United States Patent
He et al.

(10) Patent No.: US 11,101,420 B2
(45) Date of Patent: Aug. 24, 2021

(54) HIGH PERFORMANCE THERMOELECTRIC DEVICE AND METHOD OF MANUFACTURING THE SAME AT ULTRA-HIGH SPEED

(71) Applicant: SOUTH UNIVERSITY OF SCIENCE AND TECHNOLOGY OF CHINA, Guangdong (CN)

(72) Inventors: Jiaqing He, Guangdong (CN); Yi Zhou, Guangdong (CN); Liangwei Fu, Guangdong (CN); Yuexing Chen, Guangdong (CN); Dan Feng, Guangdong (CN)

(73) Assignee: SOUTH UNIVERSITY OF SCIENCE AND TECHNOLOGY OF CHINA, Shenzhen (CN)

( * ) Notice: Subject to any disclaimer, the term of this patent is extended or adjusted under 35 U.S.C. 154(b) by 3 days.

(21) Appl. No.: 16/657,080

(22) Filed: Oct. 18, 2019

(65) Prior Publication Data

US 2020/0152849 A1    May 14, 2020

Related U.S. Application Data

(63) Continuation of application No. PCT/CN2017/109980, filed on Nov. 8, 2017.

(51) Int. Cl.
*H01L 35/12* (2006.01)
*H01L 35/04* (2006.01)
*H01L 35/32* (2006.01)

(52) U.S. Cl.
CPC ............. *H01L 35/12* (2013.01); *H01L 35/04* (2013.01); *H01L 35/32* (2013.01)

(58) Field of Classification Search
CPC ......... H01L 35/04; H01L 35/12; H01L 35/32; H01L 35/34
See application file for complete search history.

(56) References Cited

U.S. PATENT DOCUMENTS 4,284,461 A * 8/1981 Frosch ................. C08K 5/0091
156/307.3
8,039,726 B2 * 10/2011 Zhang ..................... H01M 8/12
136/205

(Continued)

FOREIGN PATENT DOCUMENTS

| CN | 101447548 | 6/2009 |
| CN | 101867010 | 10/2010 |
| CN | 103187519 | 7/2013 |

OTHER PUBLICATIONS

CN 103187519 A online machine translation, translated on Jan. 16, 2021.*

(Continued)

*Primary Examiner* — Golam Mowla
(74) *Attorney, Agent, or Firm* — Hodgson Russ LLP

(57) ABSTRACT

Disclosed are a high performance thermoelectric device and a method of manufacturing the same at ultra-high speed. The high performance thermoelectric device includes segmented structures which may provide an optimal match between the thermoelectric materials and the environmental temperature difference; blocking layers and stress-buffering layers which can reduce interface element migration and longitudinal contact thermal expansion stress and increase bonding strength; phonon scattering layers and negative thermal expansion buffering layers inserted and fixing the thermoelectric leg, thereby increasing internal thermal resistance and improving transverse thermo-match for the high performance thermoelectric device; an inner package and an outer package, thus avoiding sublimation and oxidation of the thermoelectric materials and providing the thermoelectric device with enhanced impact resistance from outside.

17 Claims, 16 Drawing Sheets

(56) References Cited

U.S. PATENT DOCUMENTS

| | | | | |
|---|---|---|---|---|
| 2005/0178424 | A1* | 8/2005 | Yotsuhashi | H01L 35/22 136/201 |
| 2006/0118159 | A1* | 6/2006 | Tsuneoka | H01L 35/32 136/211 |
| 2006/0243315 | A1* | 11/2006 | Chrysler | H01L 23/38 136/201 |
| 2007/0221264 | A1* | 9/2007 | Shutoh | H01L 35/32 136/224 |
| 2008/0173343 | A1* | 7/2008 | Kanno | H01L 35/18 136/201 |
| 2009/0020322 | A1* | 1/2009 | Hsu | H01L 23/498 174/257 |
| 2009/0032080 | A1* | 2/2009 | Kawauchi | H01L 35/34 136/224 |
| 2010/0116308 | A1* | 5/2010 | Hayashi | H01L 35/32 136/236.1 |
| 2010/0229911 | A1* | 9/2010 | Leavitt | H01L 35/16 136/239 |
| 2010/0263701 | A1* | 10/2010 | Yazawa | H01L 35/34 136/203 |
| 2015/0179912 | A1* | 6/2015 | Maeshima | H01L 35/32 136/211 |

OTHER PUBLICATIONS

SIPO, First Office Action for CN Application No. 201711092495.5, dated Nov. 19, 2019.
WIPO, ISR for PCT/CN2017/109980, Aug. 7, 2018.

\* cited by examiner

US 11,101,420 B2

HIGH PERFORMANCE THERMOELECTRIC DEVICE AND METHOD OF MANUFACTURING THE SAME AT ULTRA-HIGH SPEED

CROSS-REFERENCE TO RELATED APPLICATION

This application is a continuation of International Application No. PCT/CN2017/109980, filed Nov. 8, 2017, the entire disclosure of which is incorporated herein by reference.

FIELD

The present disclosure relates to the fields of thermoelectric device and clean energy, in particular to a high performance thermoelectric device and a method of manufacturing the same at ultra-high speed.

BACKGROUND

A thermoelectric device is an environmentally-friendly clean energy device that achieves the direct conversion of thermal energy to electrical energy by mean of the Seebeck effect or the Peltier effect. This thermoelectric device has been widely applied in various important fields such as military defense, deep space and deep sea, polar exploration, biomedical, electronics industry, artificial intelligence, due to advantages of strong environmental adaptability, excellent work stability, long service life, no need for maintenance, zero noise, miniaturization, etc. The present disclosure is to provide a high performance thermoelectric device with advantages such as high energy conversion efficiency, good working stability and ultra-fast manufacture process as compared to the conventional thermoelectric device with disadvantages such as low energy conversion efficiency, low specific power, poor thermo-stability, poor impact resistance and complicated manufacture process.

SUMMARY

Embodiments of the present disclosure provide a high performance thermoelectric device and a method for preparing a high performance thermoelectric device at ultra-high speed.

In one aspect, the present disclosure provides in embodiments a high performance thermoelectric device (1). In some embodiments, the high performance thermoelectric device (1) includes a thermoelectric assembly (20), wherein the thermoelectric assembly (20) includes a plurality of thermoelectric units (10) arranged in an array and a plurality of insulating interlayers,
  wherein each thermoelectric unit (10) includes a p-type thermoelectric leg (10p) and an n-type thermoelectric leg (10n),
    wherein the p-type thermoelectric leg (10p) includes a p-type high-temperature thermoelectric leg (101p), a first blocking layer (102p), a first stress-buffering layer (103p), a second blocking layer (104p), a p-type intermediate-temperature thermoelectric leg (105p), a third blocking layer (106p), a second stress-buffering layer (107p), a fourth blocking layer (108p), a p-type low-temperature thermoelectric leg (109p) from top to bottom in sequence; and
  wherein the n-type thermoelectric leg (10n) includes an n-type high-temperature thermoelectric leg (101n), a fifth blocking layer (102n), a third stress-buffering layer (103n), a sixth blocking layer (104n), an n-type intermediate-temperature thermoelectric leg (105n), a seventh blocking layer (106n), a fourth stress-buffering layer (107n), an eighth blocking layer (108n), an n-type low-temperature thermoelectric leg (109n) from top to bottom in sequence,
    wherein the p-type thermoelectric leg (10p) and the n-type thermoelectric leg (10n) in one thermoelectric unit are connected via a ninth blocking layer (110a), a fifth stress-buffering layer (111a) and a tenth blocking layer (112a) from the p-type high-temperature thermoelectric leg (101p) to the n-type high-temperature thermoelectric leg (101n), thus forming the thermoelectric unit,
  wherein adjacent two thermoelectric units (10), which are arranged in one same row or arranged at the ends of adjacent two rows, are fixed and connected via an eleventh blocking layer (110b), a sixth stress-buffering layer (111b) and a twelfth blocking layer (112b) from the n-type low-temperature thermoelectric leg (109n) of the upstream thermoelectric unit (10) to the p-type low-temperature thermoelectric leg (109p) of the downstream thermoelectric unit (10),
  wherein the plurality of insulating interlayers (113) is provided for the plurality of thermoelectric units (10) to form the thermoelectric assembly (20),
  wherein the p-type low-temperature thermoelectric leg (109p) and the n-type low-temperature thermoelectric leg (109n) diagonally arranged at the bottom of the thermoelectric assembly (20) are provided with a first electrical output electrode (114p) and a second electrical output electrode (114n), respectively.

In an embodiment, the high performance thermoelectric device (1) is in a cubic structure.

In an embodiment, a plurality of the high performance thermoelectric devices (1) is combined in a manner of series connection, parallel connection or series-parallel connection.

In an embodiment, the p-type high-temperature thermoelectric leg (101p) is made of a material selected from a group including a p-type SiGe-based material, a p-type CoSb$_3$-based material, a p-type SnSe-based material, a p-type PbSe-based material, a p-type Cu$_2$Se-based material, a p-type BiCuSeO-based material, a p-type Half-Heusler material, a p-type Cu(In, Ga)Te$_2$ material, a p-type FeSi$_2$-based material, CrSi$_2$, MnSi$_{1.73}$, CoSi, a p-type Cu$_{1.8}$S-based material and a p-type oxide material;

the p-type intermediate-temperature thermoelectric leg (105p) is made of a material selected from a group including a p-type PbTe-based material, a p-type CoSb$_3$-based material, a p-type Half-Heusler material, a p-type Cu$_{1.8}$S-based material and a p-type AgSbTe$_2$-based material; and the p-type low-temperature thermoelectric leg (109p) is made of a material selected from a group including a p-type Bi$_2$Te$_3$-based material, a p-type Sb$_2$Se$_3$-based material and a p-type Sb$_2$Te$_3$-based material.

In an embodiment, the n-type high-temperature thermoelectric leg (101n) is made of a material selected from a group including an n-type SiGe-based material, an n-type CoSb$_3$-based material, an n-type SnSe-based material, an n-type SnTe-based material, an n-type Cu$_2$Se-based material, an n-type Half-Heusler material and an n-type oxide material;

the n-type intermediate-temperature thermoelectric leg (105n) is made of a material selected from a group including an n-type PbTe-based material, an n-type PbS-based material, an n-type $CoSb_3$-based material, an n-type $Mg_2Si$-based material, an n-type $Zn_4Sb_3$-based material, an n-type InSb-based material, an n-type Half-Heusler material, an n-type oxide material and an n-type $AgSbTe_2$-based material; and the n-type low-temperature thermoelectric leg (109n) is made of a material selected from a group including an n-type $Bi_2Te_3$-based material, an n-type BiSb-based material, an n-type $Zn_4Sb_3$-based material, an n-type $Mg_3Sb_2$-based material, an n-type $Bi_2Se_3$-based material and an n-type $Sb_2Se_3$-based material.

In an embodiment, the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are of a thickness in a range of [0.01 mm, 0.1 mm].

In an embodiment, the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are provided in a form of powders, film or foil.

In an embodiment, the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are made of a material selected from a group including gold (Au), silver (Ag), tantalum (Ta), copper (Cu), titanium (Ti), titanium nitride (TiN), titanium tungsten (TiW), nickel (Ni) and molybdenum (Mo); and wherein the first blocking layer (102p) and the ninth blocking layer (110a) are made of an identical material; the second blocking layer (104p) and the third blocking layer (106p) are made of an identical material; the fourth blocking layer (108p) and the twelfth blocking layer (112b) are made of an identical material; the fifth blocking layer (102n) and the tenth blocking layer (112a) are made of an identical material; the sixth blocking layer (104n) and the seventh blocking layer (106n) are made of an identical material; and the eighth blocking layer (108n) and the eleventh blocking layer (110b) are made of an identical material.

In an embodiment, the first stress-buffering layer (103p), the second stress-buffering layer (107p), the third stress-buffering layer (103n), the fourth stress-buffering layer (107n), the fifth stress-buffering layer (111a) and the sixth stress-buffering layer (111b) each are of a thickness in a range of [0.01 mm, 0.1 mm].

In an embodiment, the first stress-buffering layer (103p), the second stress-buffering layer (107p), the third stress-buffering layer (103n), the fourth stress-buffering layer (107n), the fifth stress-buffering layer (111a) and the sixth stress-buffering layer (111b) each are provided in a form of powders, film or foil.

In an embodiment, the first stress-buffering layer (103p), the second stress-buffering layer (107p), the fifth stress-buffering layer (111a) and the sixth stress-buffering layer (111b) each are made of a material selected from a group including copper (Cu), platinum (Pt), nickel (Ni), copper-molybdenum (Cu—Mo) alloy; the first stress-buffering layer (103p), the second stress-buffering layer (107p), the fifth stress-buffering layer (111a) and the sixth stress-buffering layer (111b) are made of an identical material; and wherein the third stress-buffering layer (103n) and the fourth stress-buffering layer (107n) each are made of a material selected from a group including molybdenum oxide ($MoO_x$), copper (Cu), platinum (Pt), nickel (Ni), copper-molybdenum (Cu—Mo) alloy; the third stress-buffering layer (103n) and the fourth stress-buffering layer (107n) are made of an identical material.

In an embodiment, the first electrical output electrode (114p) and the second electrical output electrode (114n) each are made of a material selected from a group including gold (Au), palladium (Pd), platinum (Pt), aluminum (Al), copper (Cu), nickel (Ni) and titanium (Ti); the first electrical output electrode (114p) and the second electrical output electrode (114n) are made of an identical material.

In an embodiment, each insulating interlayer (113) including a plurality of phonon scattering layers (113a) and a plurality of negative thermal expansion buffering layers (113b) stacked alternately,
wherein the plurality of insulating interlayers (113) includes a plurality of first insulating interlayers (113i), a plurality of second insulating interlayers (113ii), a plurality of third insulating interlayers (113iii) and a plurality of fourth insulating interlayers (113iv),
wherein the first insulating interlayer (113i) is inserted between the p-type thermoelectric leg (10p) and the n-type thermoelectric leg (10n) for each thermoelectric unit,
wherein the second insulating interlayer (113ii) is inserted between adjacent two thermoelectric units (10) in one same row,
wherein the third insulating interlayer (113iii) is inserted between adjacent two rows of thermoelectric units (10), and
wherein the fourth insulating interlayer (113iv) is provided at a side surface of the thermoelectric assembly (20).

In an embodiment, the high performance thermoelectric device (1) further includes a package structure, wherein the package structure includes one or more packages wrapping the thermoelectric assembly (20).

In an embodiment, the first electrical output electrode (114p) and the second electrical output electrode (114n) are respectively provided with a first electrical output wire (115p) and a second electrical output wire (115n) passing through the one or more packages.

In an embodiment, each phonon scattering layer (113a) is a nanoparticle insulating layer, a thickness of each phonon scattering layer (113a) is in a range of [1 nm, 100n m], the number of the phonon scattering layers (113a) is in a range of [10, 10000], and each phonon scattering layer (113a) is made of a material selected from a group including $SiO_2$, $Al_2O_3$, AlN, MgO, $TiO_2$, $Si_3N_4$ and SiC; and a thickness of each negative thermal expansion buffering layer (113b) is in a range of [1 nm, 100 nm], the number of the negative thermal expansion buffering layers (113b) is in a range of [10, 10000], and each negative thermal expansion buffering layer (113b) is made of a material selected from a group including $BaTiO_3$, $PbTiO_3$, $LaCrO_3$, $ZrW_2O_8$, $ZrV_2O_7$ and $HfW_2O_8$.

In an embodiment, the package structure includes an inner package (201) and an outer package (202),
wherein the inner package (201) is made of a material selected from a group including carbon fiber and Graphite Epoxy Composite, and the outer package (202) is made of a material selected from a group including a FeNi KOVAR alloy.

In another aspect, the present disclosure provides in embodiments a method of manufacturing a high performance thermoelectric device (1) at ultra-high speed. In some embodiments, the method includes:

weighing respective elemental powders for a p-type high-temperature thermoelectric leg (101p), a p-type intermediate-temperature thermoelectric leg (105p), a p-type low-temperature thermoelectric leg (109p), an n-type high-temperature thermoelectric leg (101n), an n-type intermediate-temperature thermoelectric leg (105n) and an n-type low-temperature thermoelectric leg (109n), at a stoichiometric ratio of respective elements, to obtain respective powders for individual thermoelectric materials;

weighing respective elemental powders for a first blocking layer (102p), a second blocking layer (104p), a third blocking layer (106p), a fourth blocking layer (108p), a fifth blocking layer (102n), a sixth blocking layer (104n), a seventh blocking layer (106n), an eighth blocking layer (108n), a ninth blocking layer (110a) and a tenth blocking layer (112a), to obtain respective powders of individual blocking layers;

weighing respective elemental powders for a first stress-buffering layer (103p), a second stress-buffering layer (107p), a third stress-buffering layer (103n), a fourth stress-buffering layer (107n) and a fifth stress-buffering layer (111a), to obtain respective powders of individual stress-buffering layers;

placing the respective powders of individual thermoelectric materials, the respective powders of individual blocking layers and the respective powders of individual stress-buffering layers in a space enclosed by a mold (302), an upper pressing head (301) and a lower pressing head (306) in a sequence of a thermoelectric material layer, a blocking layer, a stress-buffering layer, a blocking layer, a thermoelectric material layer, a blocking layer, a thermoelectric material layer, a blocking layer, a stress-buffering layer, a blocking layer, a thermoelectric material layer for each thermoelectric leg, wherein a p-type thermoelectric leg (10p) and an n-type thermoelectric leg (10n) formed with the respective powders of individual layers are connected via the ninth blocking layer (110a), the fifth stress-buffering layer (111a) and the tenth blocking layer (112a) from the p-type high-temperature thermoelectric leg (101p) to the n-type high-temperature thermoelectric leg (101n); and are partitioned by a first partition (303), a middle partition (305) and a second partition (304), which are subjected to spark plasma sintering, thus forming a thermoelectric block;

cutting the thermoelectric block to form a thermoelectric unit (10);

providing a plurality of phonon scattering layers (113a) and a plurality of negative thermal expansion buffering layers (113b) alternately by chemical vapor deposition, thus forming an insulating interlayer (113), and inserting the insulating interlayer (113) between the p-type thermoelectric leg (10p) and the n-type thermoelectric leg (10n) for fixing the thermoelectric unit (10);

arranging a plurality of thermoelectric units (10) in an array; providing, by depositing, electroplating or sputtering, an eleventh blocking layer (110b), a sixth stress-buffering layer (111b) and a twelfth blocking layer (112b) from a protruding section of the n-type low-temperature thermoelectric leg (109n) of the upstream thermoelectric unit (10) to a protruding section of the p-type low-temperature thermoelectric leg (109p) of the downstream thermoelectric unit (10) for adjacent two thermoelectric units (10), which are arranged in one same row or arranged at the ends of adjacent two rows, such that a thermoelectric assembly (20) is formed; and providing, by depositing, electroplating or sputtering, a first electrical output electrode (114p) and a second electrical output electrode (114n) for the thermoelectric assembly (20) and providing a first electrical output wire (115p) and a second electrical output wire (115n) connecting to the first electrical output electrode (114p) and the second electrical output electrode (114n) respectively.

In an embodiment, the method further includes wrapping the thermoelectric assembly (20) with carbon fiber by means of a high-temperature sealant, so as to form an inner package (201); and wrapping the inner package (201) with a FeNi KOVAR alloy, so as to form an outer package (202) which is sealed by a sealant.

In an embodiment, the upper pressing head (301) and the lower pressing head (306) each are made of graphite;

the mold (302) is made of a material selected from a group including graphite, alloy, $Al_2O_3$-based ceramic, AlN-based ceramic, $Si_3N_4$-based ceramic or SiC-based ceramic;

the first partition (303), the middle partition (305) and the second partition (304) each are made of graphite or ceramic; and the first partition (303), the middle partition (305) and the second partition (304) are made of an identical material.

In the present disclosure, the thermoelectric device is based on a working principle that: for a thermoelectric device, because holes and electrons inside the p-type thermoelectric leg (10p) and the n-type thermoelectric leg (10n) migrate under a temperature difference, segmented high temperature, moderate temperature and low temperature thermoelectric materials are provided for maximum taking an advantage of the temperature difference between the cold-surface temperature and the hot-surface temperature; and a composite of alternated nano-structural phonon scattering layers (113a) and negative thermal expansion buffering layers (113b) is designed and provided for the thermoelectric device with consideration of a difference of mean free paths between phonons and electrons (where the mean free path is on the order of 1 nm for the electrons and 100 nm for the phonon), by which the designed composite can increase phonon scatter of the thermoelectric materials while decrease and even eliminate contact thermal expansion between different materials; as well an inner package (201) and an outer package (202) are provided for improving working stability of the thermoelectric device.

In embodiments of the present disclosure, the provided high performance thermoelectric device (1) includes segmented high temperature, moderate temperature and low temperature thermoelectric materials, alternated phonon scattering layers and negative thermal expansion buffering layers (113b), an inner package (201) and an outer package (202), with advantages such as high energy conversion efficiency, large output power, strong environmental adaptability, good working stability, long service life, easy implementation, as compared to the conventional thermoelectric device with disadvantages such as low energy conversion efficiency, low specific power, poor thermo-stability, poor impact resistance and complicated manufacture process. Accordingly, the high performance thermoelectric device (1) provided in embodiments of the present application can work stably for a long period in several critical fields such as military defense, deep space and deep sea, polar exploration, biomedical, electronics industry, artificial intelligence, further providing environmental protection, efficiency, convenience and wide application for energy conversion.

The main advantages of the high performance thermoelectric device (1) in provided embodiments of the present disclosure as compared to the prior art include but not limited to the followings:

1. The high performance thermoelectric device (1) provided in embodiments of the present application includes segmented high-temperature, intermediate-temperature and low-temperature thermoelectric materials, blocking layers, stress-buffering layers, insulating interlayers formed with alternated nanoparticle phonon scattering layers (113a) and negative thermal expansion buffering layers, the package structure. Such a structure greatly improves electrical output performance and working stability, which overcomes technical disadvantages of the conventional thermoelectric device, such as low energy conversion efficiency, low volumetric specific power, poor working stability and poor impact resistance caused by contact thermal expansion, element migration and diffusion, and sublimation and oxidation of the thermoelectric material.

2. The thermoelectric unit (10) provided in embodiments of the present application is manufactured in one-shot molding by a hot-pressing process in combination with partitions, such that segmented high-temperature, intermediate-temperature and low-temperature thermoelectric materials can be directly sintered together with the blocking layers and stress-buffering layers, thereby reducing mutual diffusion between elements, increasing interlayer bonding strength and thermo-match degree and decreasing contact resistance for the segmented thermoelectric device.

3. In one thermoelectric unit, the p-type thermoelectric leg (10p) and the n-type thermoelectric leg (10n) are connected via a blocking layer, a stress-buffering layer, and another blocking layer from the p-type high-temperature thermoelectric leg (101p) to the n-type high-temperature thermoelectric leg (101n), with the first insulating interlayer inserted where are not connected. The insulating interlayer each formed with alternate nanoparticle phonon scattering layers and negative thermal expansion buffering layers are provided to take up gaps between any adjacent thermoelectric legs where instead air exists for the conventional thermoelectric device and to support adjacent p-type thermoelectric leg (10p) and n-type thermoelectric leg (10n), thereby increasing internal thermal resistance, decreasing contact resistance, increasing volumetric specific power, enhancing phonon scatter, reducing contact thermal expansion, avoiding current reflow, and greatly improving energy conversion efficiency for the thermoelectric device, thus meeting requirements on low carbon environmental protection, integration and high efficiency, and economic universality for energy conversion.

4. In embodiments of the present disclosure, the inner package (201) and outer package (202) are provided for fixing the thermoelectric assembly (20), which serve as cushions for mechanical extrusion and thermo-stress existing inside the thermoelectric device and for mechanical impact to the thermoelectric device from outside environment, thereby providing a self-repair function to some extent and thus allowing the thermoelectric device to be able to work under various extreme environment.

Additional aspects and advantages of embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the drawings, in which.

Figure 1:
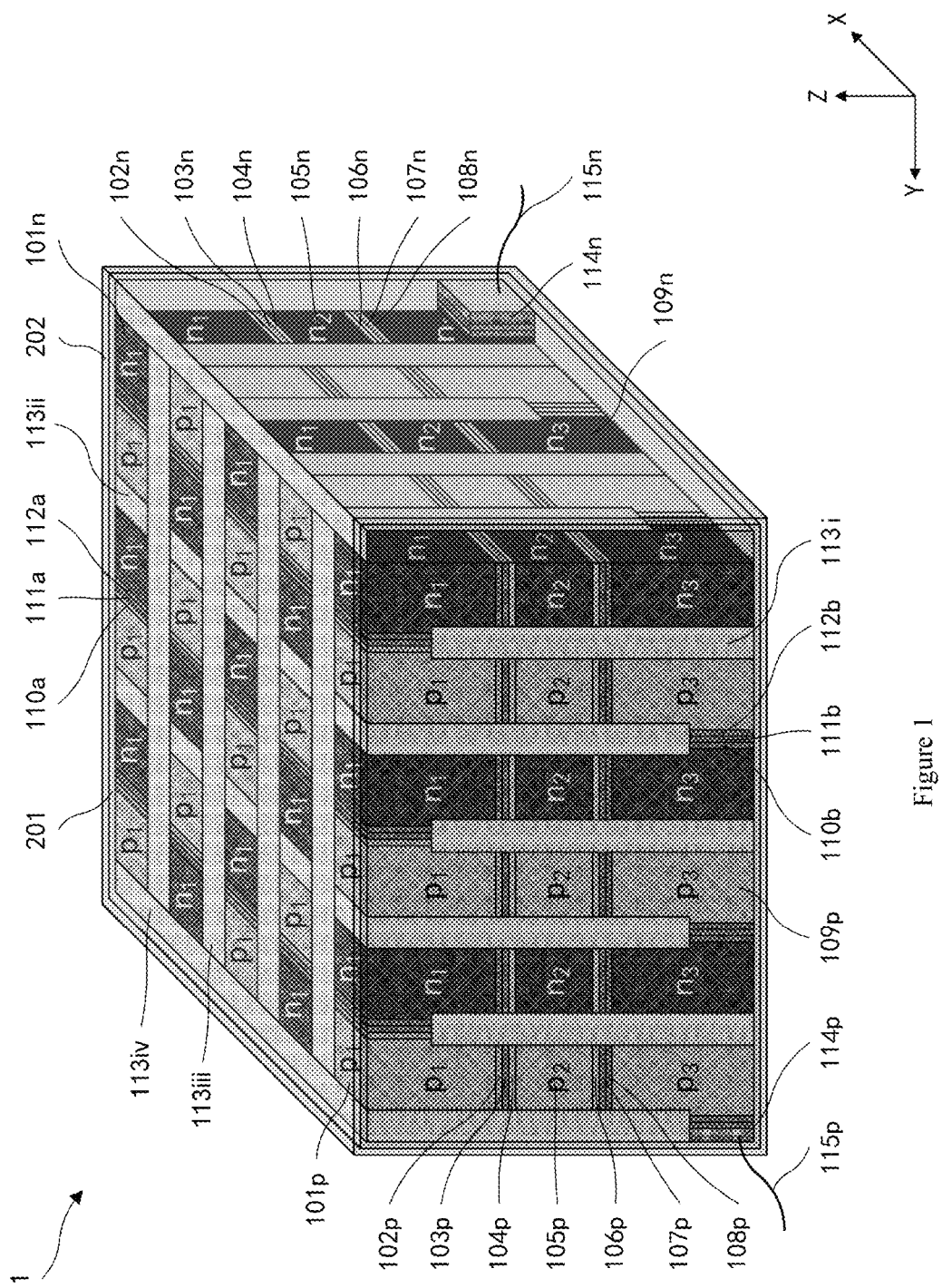
FIG. 1 is a structural representation showing a high performance thermoelectric device in some embodiments of the present disclosure.
Figure 2:
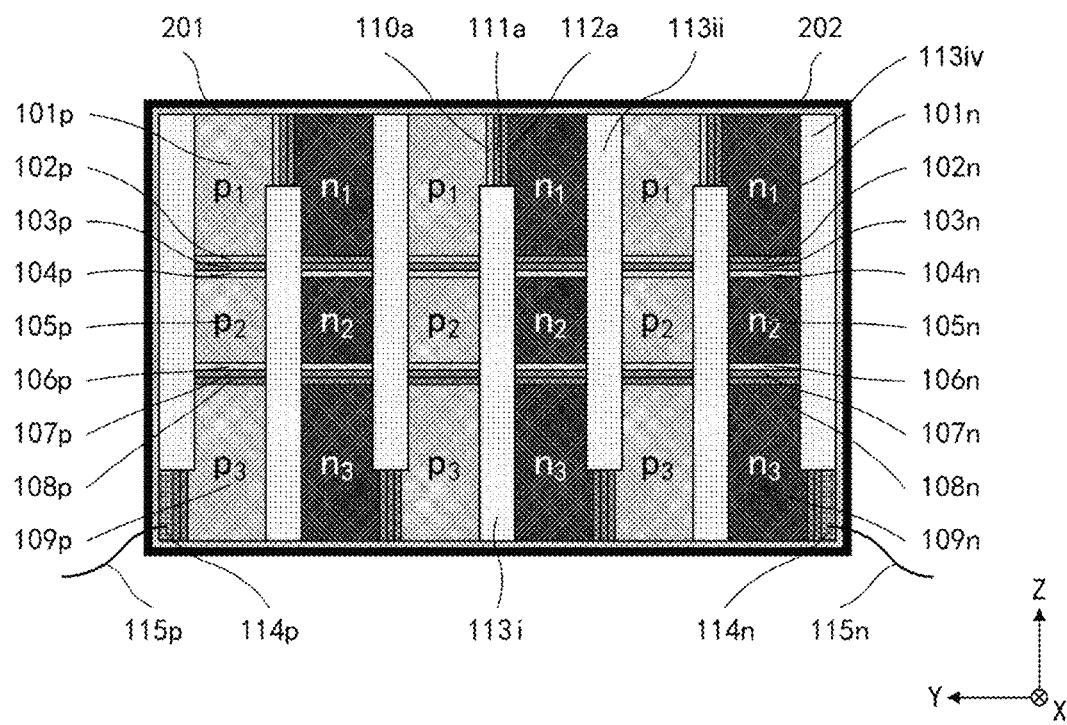
FIG. 2 is a structural representation showing a front view for a high performance thermoelectric device in some embodiments of the present disclosure.
Figure 3:
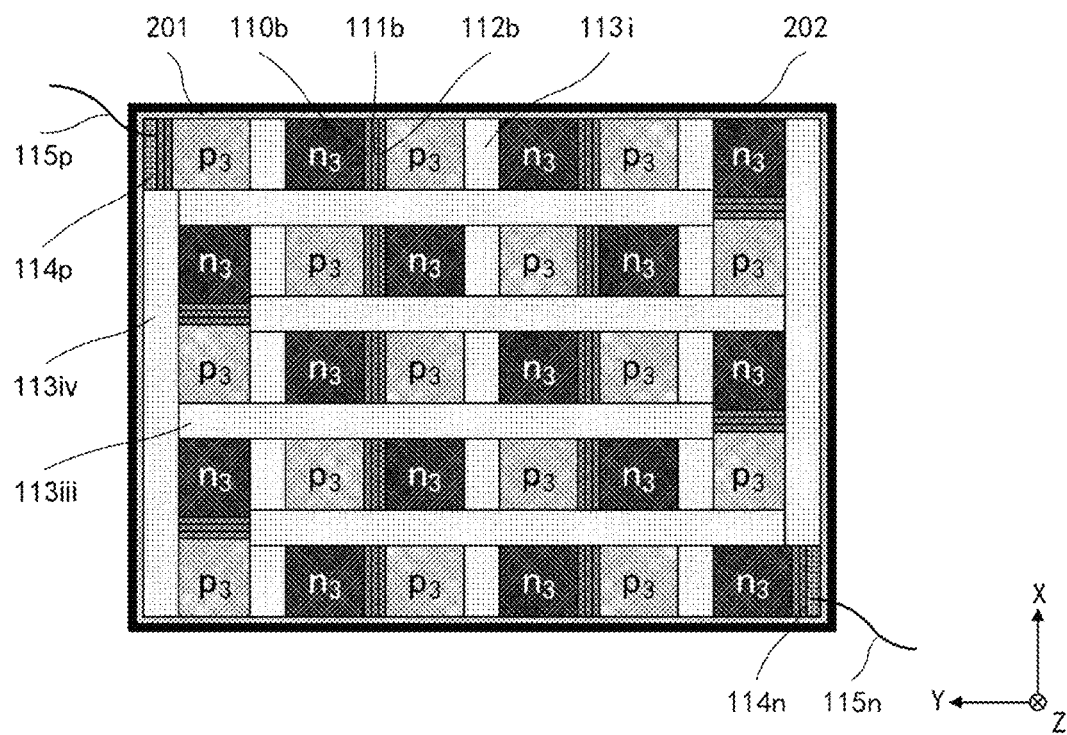
FIG. 3 is a structural representation showing a front view (a cold-surface) for a high performance thermoelectric device in some embodiments of the present disclosure.
Figure 4:
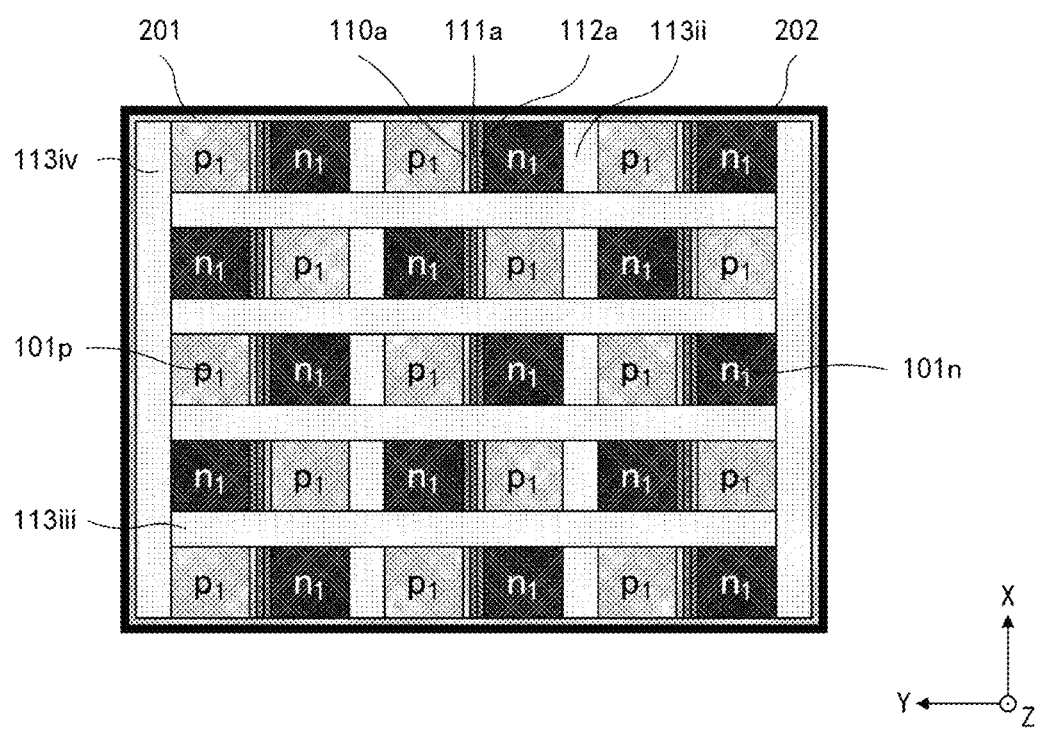
FIG. 4 is a structural representation showing a front view (a hot-surface) for a high performance thermoelectric device in some embodiments of the present disclosure.
Figure 5:
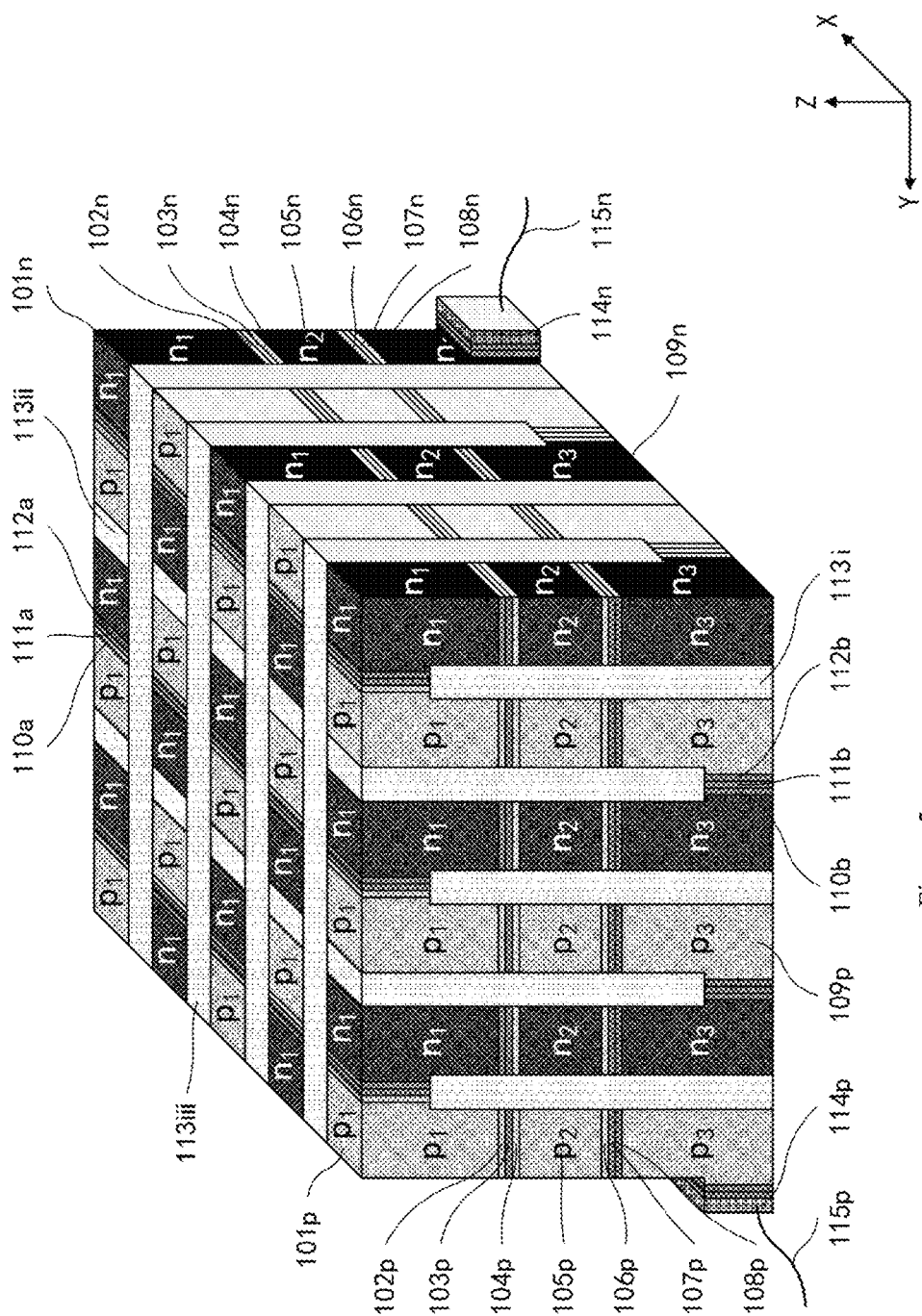
FIG. 5 is a structural representation showing a high performance thermoelectric device to be packaged in some embodiments of the present disclosure.

MAIN ELEMENTS AND DENOTATION high performance thermoelectric device 1,
thermoelectric unit 10,
thermoelectric assembly 20,
p-type thermoelectric leg 10p,
n-type thermoelectric leg 10n,
p-type high-temperature thermoelectric leg 101p,
first blocking layer 102p,
first stress-buffering layer 103p,
second blocking layer 104p,
p-type intermediate-temperature thermoelectric leg 105p,
third blocking layer 106p,
second stress-buffering layer 107p,
fourth blocking layer 108p,
p-type low-temperature thermoelectric leg 109p,
n-type high-temperature thermoelectric leg 101n,
fifth blocking layer 102n,
third stress-buffering layer 103n,
sixth blocking layer 104n,
n-type intermediate-temperature thermoelectric leg 105n,
seventh blocking layer 106n,
fourth stress-buffering layer 107n,
eighth blocking layer 108n,
n-type low-temperature thermoelectric leg 109n,
ninth blocking layer 110a,
fifth stress-buffering layer 111a,
tenth blocking layer 112a,
eleventh blocking layer 110b,
sixth stress-buffering layer 111b,
twelfth blocking layer 112b,
insulating interlayer 113,
first insulating interlayer 113i,
second insulating interlayer 113ii,
third insulating interlayer 113iii fourth insulating interlayer 113iii
phonon scattering layer 113a,
negative thermal expansion buffering layer 113b,
first electrical output electrode 114p,
first electrical output wire 115p,
second electrical output electrode 114n,
second electrical output wire 115n;
inner package 201, outer package 202;
upper pressing head 301, mold 302, first partition 303, second partition 304, middle partition 305, lower pressing head 306

DETAILED DESCRIPTION

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In addition, terms such as "first" and "second" are used herein for purposes of description and are not intended to indicate or imply relative importance or significance or to imply the number of indicated technical features. Thus, the feature defined with "first" and "second" may comprise one or more of this feature explicitly or implicitly. In the description of the present disclosure, term "a plurality of" means two or more than two, unless specified otherwise.

In the present invention, unless specified or limited otherwise, the terms "mounted", "connected", "coupled" and the like should be understood broadly, and may be, for example, fixed connections, detachable connections, or integral connections; may also be a mechanical, electrical or communicational connection; may also be direct connections or indirect connections via an intervening medium; may also be inner communications or interactions of two elements, which can be understood by those skilled in the art according to specific situations.

In recent years, the thermoelectric device has been received extensive attention from academia and industry for raw material cost, material property, manufacturing process, etc.

In regard of the raw material, an inorganic thermoelectric device is manufactured with a $CoSb_3$-based material, a SnSe-based material, a $Cu_2Se$-based material, a $Mg_2Si$-based material, an oxide material, graphene, and a topological insulator (which are at high element abundance in the earth and thus at low cost), instead of a conventional $Bi_2Te_3$-based material which is at rare element abundance. Besides, some attempts have been made to manufacture an organic thermoelectric device using a conductive polymer, a charge transfer complex and a metal-organic coordination polymer.

In regard of material property, thermoelectric conversion efficiency can be represented by a formula of $$\eta_{TE} = \frac{\Delta T}{T_C} \frac{\sqrt{1+ZT}-1}{\sqrt{1+ZT}+(T_C/T_H)},$$

where ZT refers to the thermoelectric figure of merit at dependent temperature, $T_C$ refers to a cold-surface temperature, and $T_H$ refers to a hot-surface temperature. $\eta_{TE}(ZT,T_C,T_H)$ can be optimized in terms of the thermoelectric figure of merit (ZT), and a temperature difference $\Delta T$ between the cold-surface temperature and the hot-surface temperature.

Recently, numerous thermoelectric materials with high thermoelectric figure of merit have been reported, including conventional PbTe whose ZT reaches to 2.2 at 915 K; SnSe whose ZT reaches to 2.6 at 923 K; and $Cu_2Se$ whose ZT reaches to 2.6 at 850 K. However, a thermoelectric device, made of conventional $Bi_2Te_3$ whose ZT is 1.4 at 450 K, exhibits a thermoelectric conversion efficiency of only 6% when the temperature difference is 217 K. On the other hand, in order to effectively utilize the maximum temperature difference between the cold-surface temperature and the hot-surface temperature, a segmented structure is designed for the thermoelectric device. For example, a $Bi_2Te_3/CoSb_3$ segmented thermoelectric device exhibits the thermoelectric conversion efficiency up to 12% in experiments. In addition, the thermoelectric device is provided with increased internal thermal resistance by guiding moving direction of heat flow or carriers; and the thermoelectric device is also provided with decreased contact resistance by increasing the contact area with an electrode, so as to enlarge the temperature difference and thus enhance electrical output performance.

In regard of the manufacturing process, several techniques have been disclosed in the related art, including metal organic chemical vapor deposition (MOCVD) for manufacture of a nano-superlattice thermoelectric thin film; adjustment of a structure volume ratio inside the thermoelectric device for improvement of volumetric specific power and thermo-match; a spark plasma sintering (SPS) process for flash sintering a thermoelectric material in form of elemental powders into a thermoelectric block; a patterned mask in combination with positioning balls for directional deposition of a target thermoelectric leg; semiconductor integration in combination with micro-nano processing technology for manufacture of a nanowire thermoelectric device; and rapid manufacture of a millimeter-scale thin film thermoelectric device using inkjet printing, selective laser melting 3D printing and additive manufacturing technology by the self-propagating combustion, thermal explosion reaction.

In addition, in order to avoid a thermoelectric material from element sublimation at a high temperature and to avoid a periodic thermal cycle device from performance reduction, an alloy layer and a diffusion blocking layer are provided between a thermoelectric material layer and an electrode layer; the thermoelectric device is coated with an organic/inorganic ceramic coating/porous glass topping; and the thermoelectric material is provided with connection transition layer/blocking layer at its high temperature end, which benefits forming a diffusion layer at the contact interface.

Although the thermoelectric device has been improved for its performance to some extents by the above mentioned efforts, as well the method for manufacturing the thermoelectric device has been advanced, there still exist some urgent issues in need of settlement in terms of manufacturing the thermoelectric device industrially in large scale. For example, it is required to avoid the thermoelectric material from direct contact with external environment, so as to prevent the thermoelectric material from outward sublimation and inward oxidation; there are needs in improvement of thermo-stability for a thermoelectric leg and in reduction or even elimination of expansion and crack generation caused by thermal contact; and the thermoelectric device should maintain excellent electrical output performance and working stability for a long period.

The following disclosure provides many different embodiments or examples for implementing the different structures of the present disclosure. To simplify the present disclosure, description is made hereinbelow in specific examples for individual components and configuration. Of course, they are merely examples and are not intended to limit the present disclosure. In addition, reference numerals and/or reference characters used herein may be repeated in the different examples. Such a repeat is for the purpose of simplicity and clarity but does not indicate the relationship between the various embodiments and/or configurations in question. Moreover, the present disclosure provides examples of various particular processes and materials, but one of ordinary skill in the art will recognize other processes and/or other materials are also available for use.

With reference to FIG. 1 to FIG. 7, the present disclosure provides in embodiments a high performance thermoelectric device 1, including a thermoelectric assembly 20 (refer to FIG. 16) and a package structure.

In some embodiments, the thermoelectric assembly 20 includes a plurality of thermoelectric units 10 arranged in an array (refer to FIG. 10) and a plurality of insulating interlayers. With reference to FIG. 10 to FIG. 16, each thermoelectric unit 10 includes a p-type thermoelectric leg 10$p$ and an n-type thermoelectric leg 10$n$. The p-type thermoelectric leg 10$p$ includes a p-type high-temperature thermoelectric leg 101$p$, a first blocking layer 102$p$, a first stress-buffering layer 103$p$, a second blocking layer 104$p$, a p-type intermediate-temperature thermoelectric leg 105$p$, a third blocking layer 106$p$, a second stress-buffering layer 107$p$, a fourth blocking layer 108$p$, a p-type low-temperature thermoelectric leg 109$p$ from top to bottom in sequence. The n-type thermoelectric leg 10$n$ includes an n-type high-temperature thermoelectric leg 101$n$, a fifth blocking layer 102$n$, a third stress-buffering layer 103$n$, a sixth blocking layer 104$n$, an n-type intermediate-temperature thermoelectric leg 105$n$, a seventh blocking layer 106$n$, a fourth stress-buffering layer 107$n$, an eighth blocking layer 108$n$, an n-type low-temperature thermoelectric leg 109$n$ from top to bottom in sequence. The p-type thermoelectric leg 10$p$ and the n-type thermoelectric leg 10$n$ in one thermoelectric unit are connected via a ninth blocking layer 110$a$, a fifth stress-buffering layer 111$a$ and a tenth blocking layer 112$a$ from the p-type high-temperature thermoelectric leg 101$p$ to the n-type high-temperature thermoelectric leg 101$n$. Adjacent two thermoelectric units 10, which are arranged in one same row or arranged at the ends of adjacent two rows, are fixed and connected via an eleventh blocking layer 110$b$, a sixth stress-buffering layer 111$b$ and a twelfth blocking layer 112$b$ from the n-type low-temperature thermoelectric leg 109$n$ to the p-type low-temperature thermoelectric leg 109$p$. The insulating interlayer 113 is provided for fixing the thermoelectric unit 10.

In some embodiments, the thermoelectric assembly 20 is wrapped with an inner package 201, and the inner package 201 is further wrapped with an outer package 202.

In some embodiments, the p-type low-temperature thermoelectric leg 109$p$ and the n-type low-temperature thermoelectric leg 109$n$ diagonally arranged at bottom of the thermoelectric assembly 20 are provided with a first electrical output electrode 114$p$ and a second electrical output electrode 114$n$, respectively. In some embodiments, a first electrical output wire 115$p$ is connected to the first electrical output electrode 114$p$ through the outer package 202 and the inner package 201 in sequence; and a second electrical output wire 115$n$ is connected to the second electrical output electrode 114$n$ through the outer package 202 and the inner package 201 in sequence.

Figure 11:
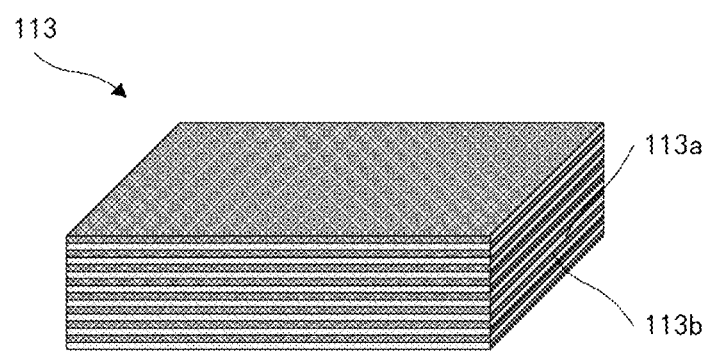
Figure 12:
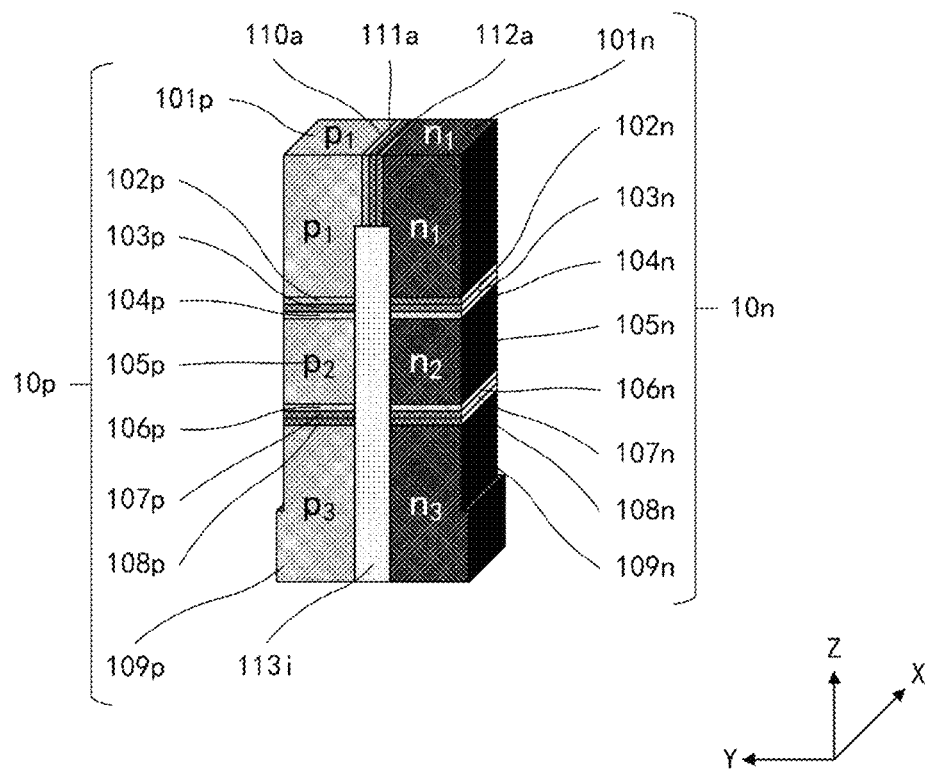
Figure 13:
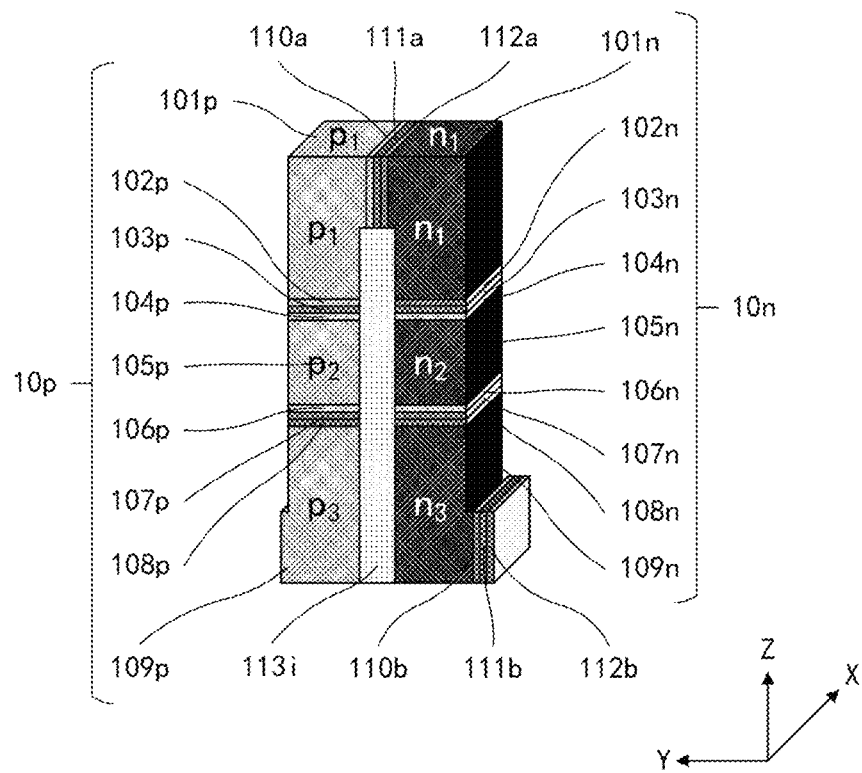
Figure 14:
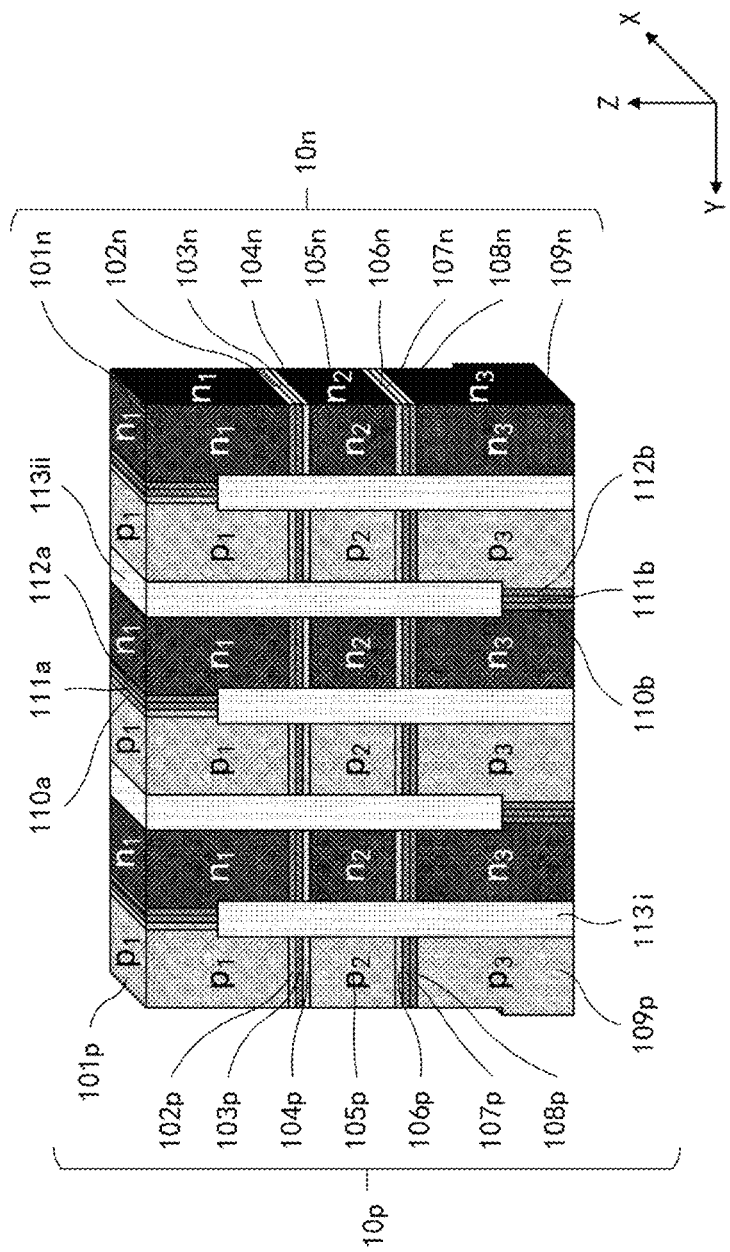
Figure 15:
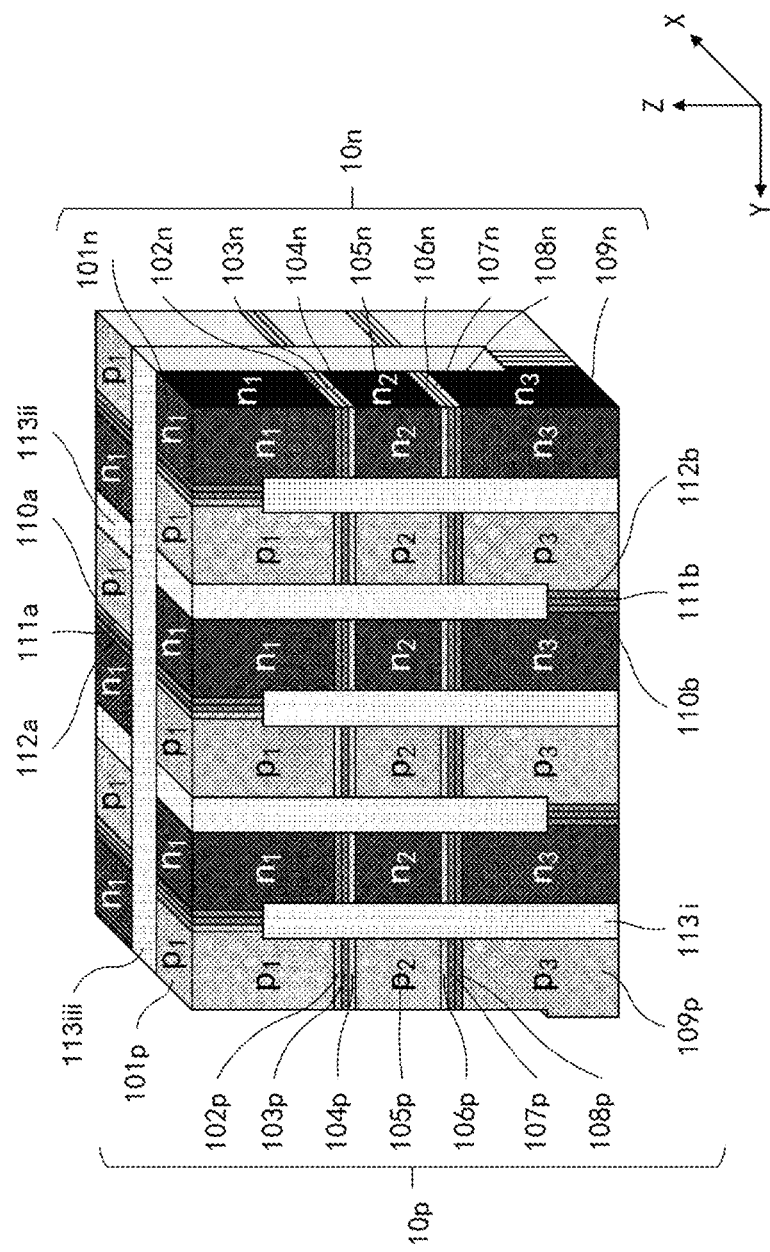
Figure 18:
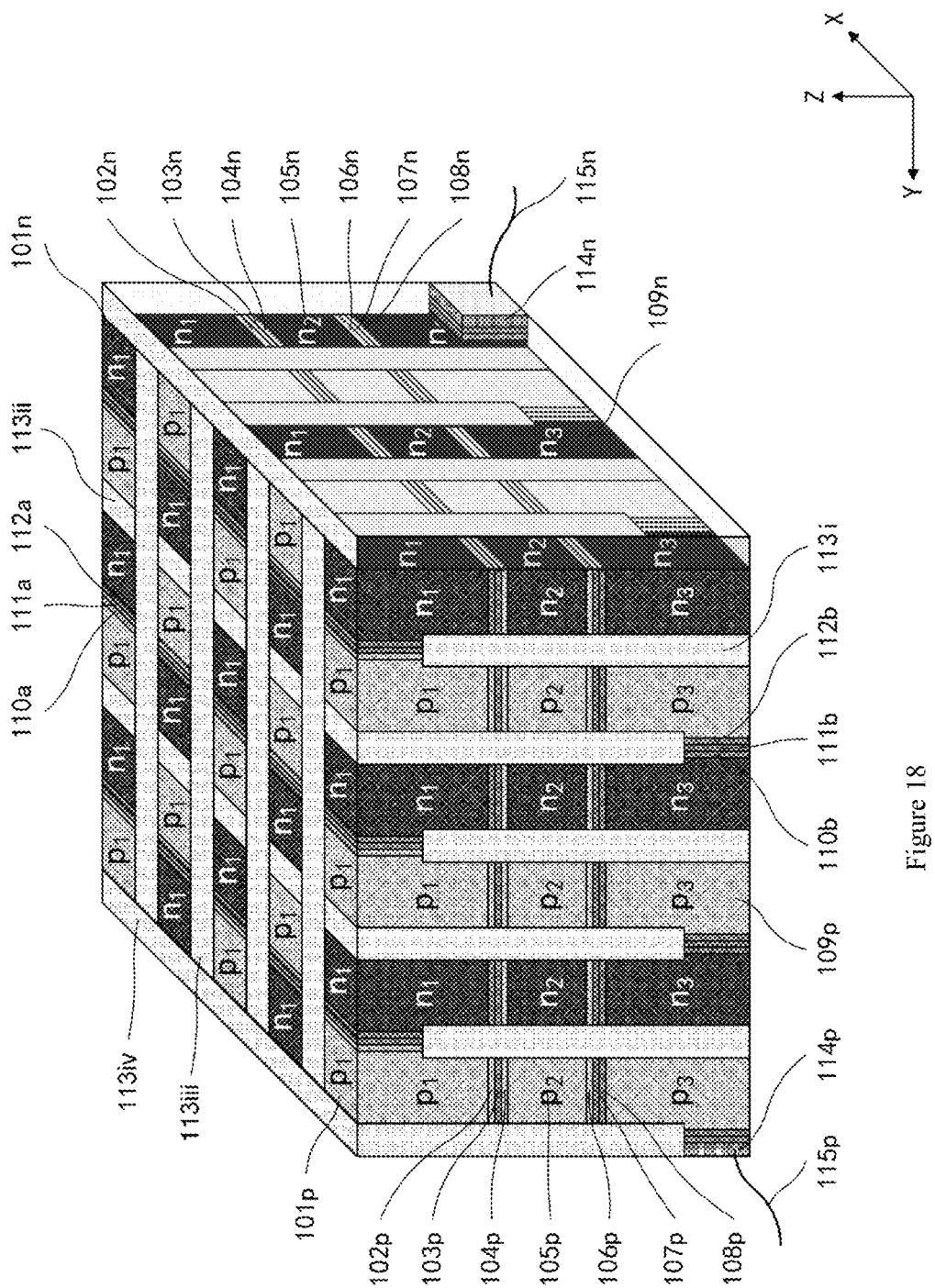
Figure 19:
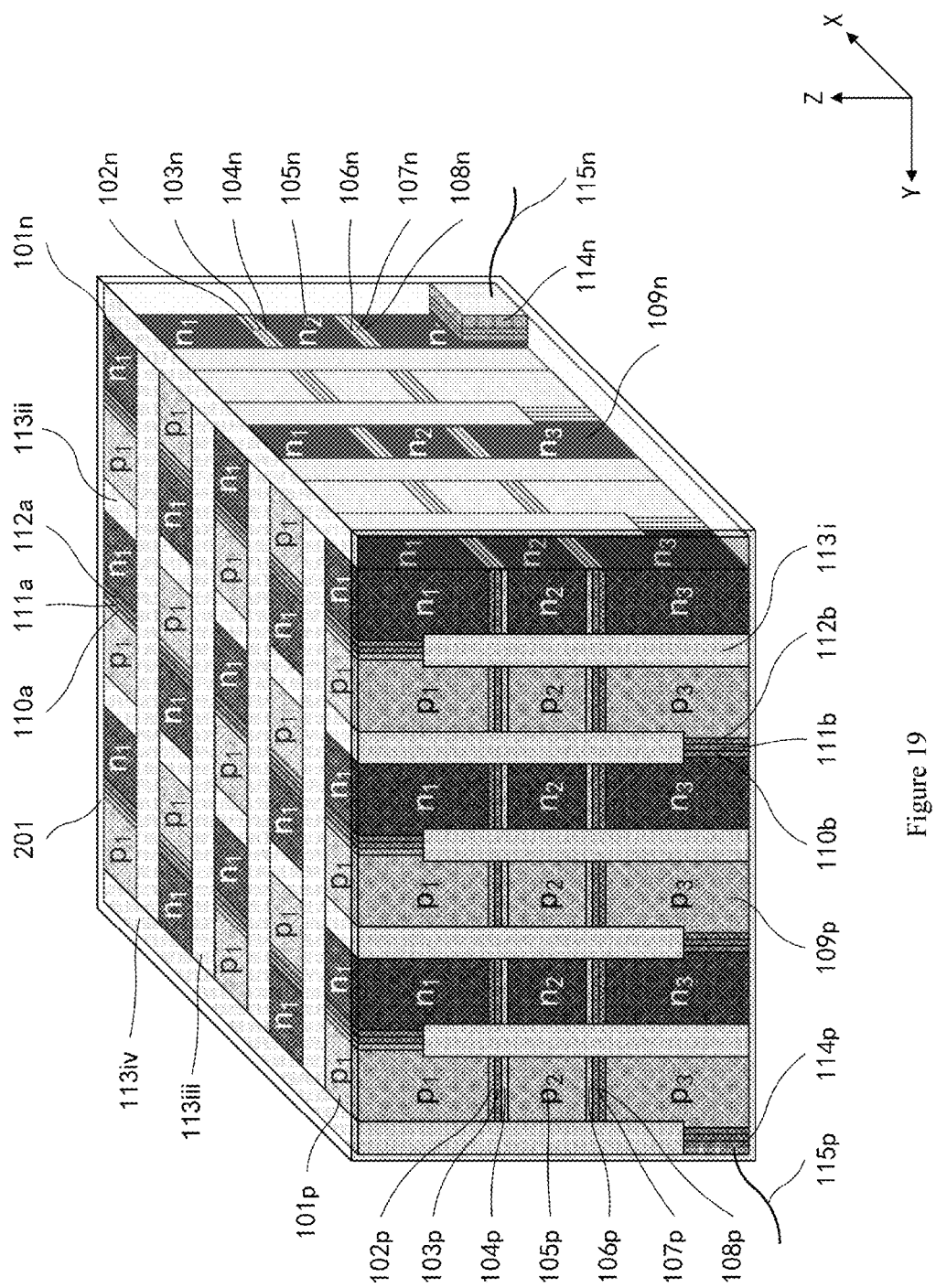
Figure 20:
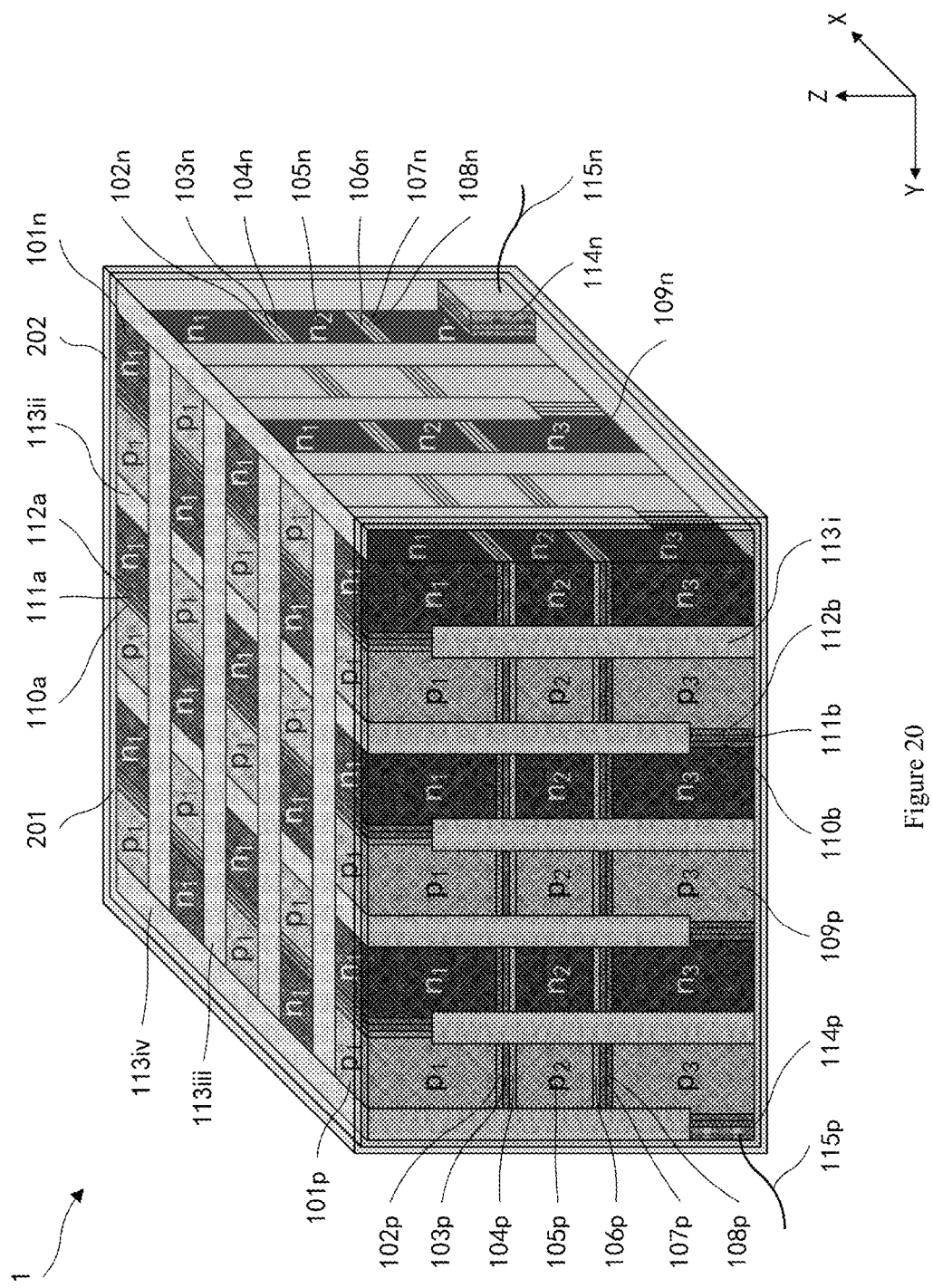

With reference to FIG. 11, each insulating interlayer 113 is a composite including a plurality of phonon scattering layers 113$a$ and a plurality of negative thermal expansion buffering layers 113$b$ stacked alternately. The phonon scattering layer 113$a$ is made of insulating nanoparticles without contact therebetween. The plurality of insulating interlayers 113 includes a plurality of first insulating interlayers 113$i$, a plurality of second insulating interlayers 113$ii$, a plurality of third insulating interlayers 113$iii$ and a plurality of fourth insulating interlayers 113$iv$. The first insulating interlayer 113$i$ is inserted between the p-type thermoelectric leg 10$p$ and the n-type thermoelectric leg 10$n$ for each thermoelectric unit 10 (refer to FIG. 12 to FIG. 18). The second insulating interlayer 113$ii$ is inserted between adjacent two thermoelectric units 10 in one same row (refer to FIG. 14 to FIG. 18). The third insulating interlayer 113$iii$ is inserted between adjacent two rows of thermoelectric units 10 (refer to FIG. 15 to FIG. 18). The fourth insulating interlayer 113$iv$ is provided at a side surface of the thermoelectric assembly 20. In other words, the fourth insulating interlayer 113$iv$ is provided between the outer surface of the thermoelectric assembly 20 and the inner package 201. In some embodiments, the fourth insulating interlayer 113$iv$ is only provided at the left and right sides of the outer surfaces of the thermoelectric assembly 20 (refer to FIG. 18 to FIG. 20).

Figure 6:
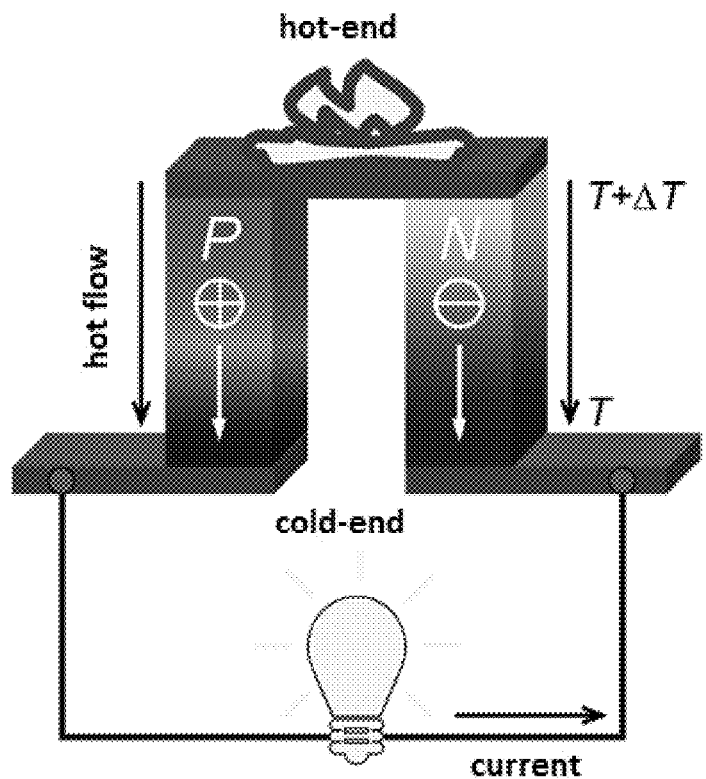
FIG. 6 is a diagram showing a Seebeck-based working principle for a thermoelectric device.
Figure 7:
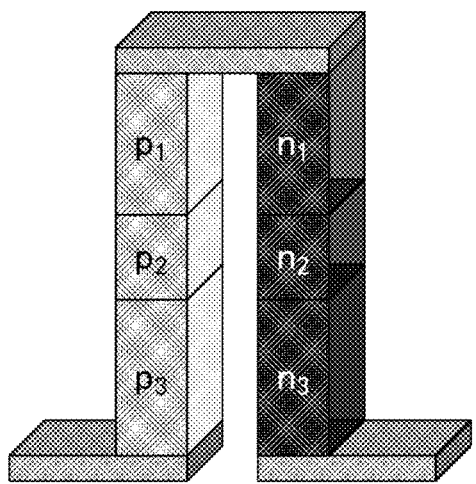
FIG. 7 is a structural representation showing a conventional segmented thermoelectric device.
Figure 8:
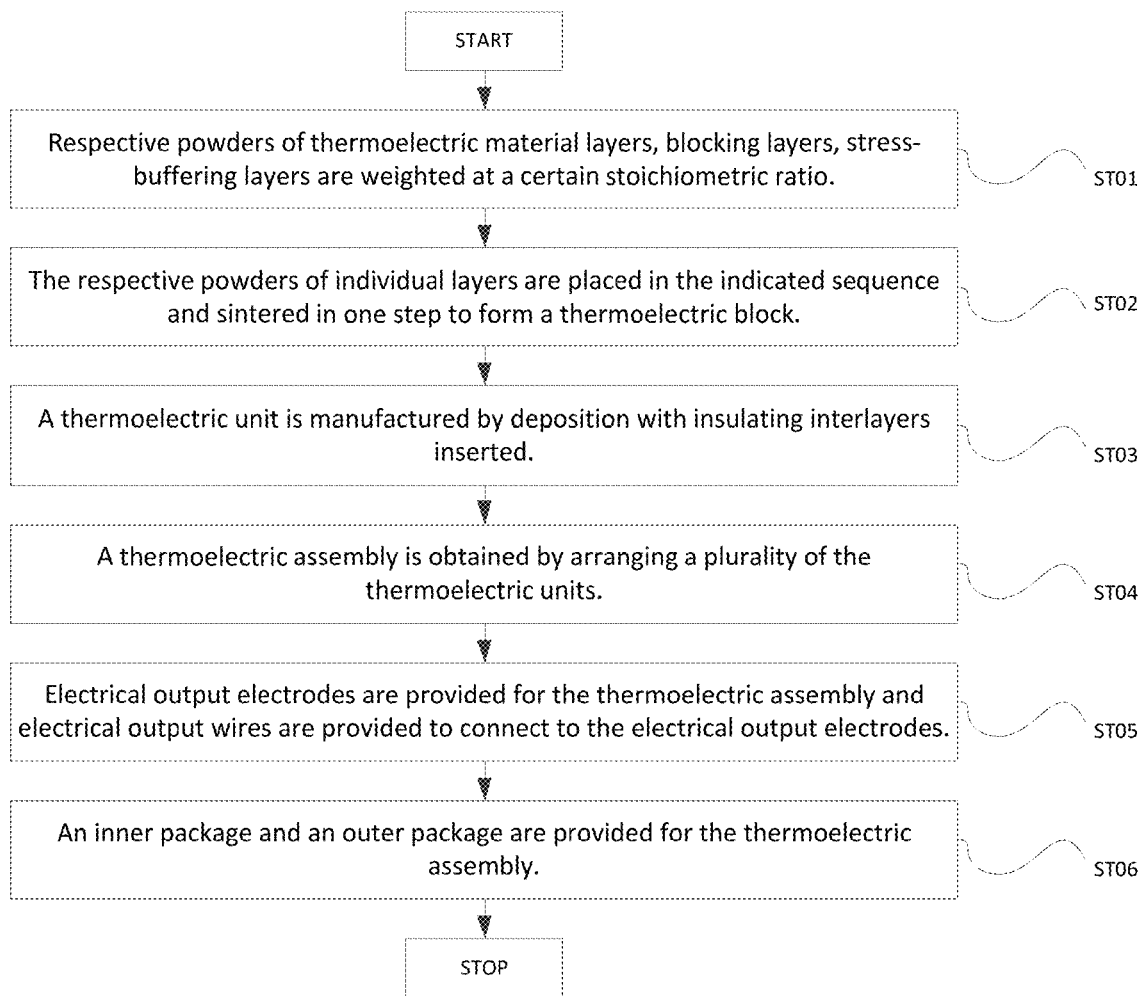
FIG. 8 is a flow chart showing a method of manufacturing a high performance thermoelectric device at ultra-high speed in some embodiments of the present disclosure.

With reference to FIG. 6, for the high performance thermoelectric device 1 in embodiments of the present disclosure, holes and electrons inside the p-type thermoelectric leg 10$p$ and the n-type thermoelectric leg 10$n$ migrate under a temperature difference, such that thermal energy is converted to electrical energy.

For the high performance thermoelectric device 1 in embodiments of the present disclosure, segmented high-temperature, intermediate-temperature and low-temperature thermoelectric materials are provided for maximum taking the advantage of the temperature difference between the cold-surface temperature and the hot-surface temperature, so as to improve energy conversion efficiency; at the same time, the blocking layers, the stress-buffering layers, the insulating layers made of alternate phonon scattering layer 113$a$ and negative thermal expansion buffering layer 113$b$, the package structure are provided in the segmented structure, such that the high performance thermoelectric device 1 is greatly improved for electrical output performance and working stability, which overcomes disadvantages of the conventional thermoelectric device (refer to FIG. 7), such as low energy conversion efficiency, low volumetric specific power, poor working stability and poor impact resistance caused by contact thermal expansion, element migration and diffusion, and sublimation and oxidation of the thermoelectric material.

Further, for the high performance thermoelectric device 1 in embodiments of the present disclosure, the blocking layer not only prevents elements from mutual diffusion between the thermoelectric material (i.e., respective materials for the p-type thermoelectric leg 10$p$ and the n-type thermoelectric leg 10$n$) and the corresponding stress-buffering layers during sintering at the high temperature in manufacture of the high performance thermoelectric device 1, but also enhances the bonding strength between the thermoelectric material and the corresponding stress-buffering layers, thus forming good ohmic contact and reducing contact resistance. Further, for the high performance thermoelectric device 1 in embodiments of the present disclosure, the material for the blocking layer is in well ingredient-, structure- and thermo-match with the thermoelectric material and with the powders for the stress-buffering layer, thus forming a fitted and fixed structure at the interfaces between the powders for the thermoelectric material and the powders for the blocking layer and between the powders for the stress-buffering layer and the powders for the blocking layer, and in consequence increasing the bonding strength, reducing cracks, preventing element migration at the contact interface, decreasing contact resistance, and enhancing carrier extraction capacity.

In addition, for the high performance thermoelectric device 1 in embodiments of the present disclosure, in one thermoelectric unit, the p-type thermoelectric leg 10$p$ and the n-type thermoelectric leg 10$n$ are connected via a blocking layer, a stress-buffering layer, and another blocking layer from the p-type high-temperature thermoelectric leg 101$p$ to the n-type high-temperature t thermoelectric leg 101$n$, with the first insulating interlayer inserted where are not connected. With consideration of a difference of mean free paths between phonons and electrons (where the mean free path is on the order of 1 nm for the electrons and 100 nm for the phonon), the insulating interlayers each formed with alternate nanoparticle phonon scattering layers 113$a$ and negative thermal expansion buffering layers 113$b$ are provided to take up gaps between any adjacent thermoelectric legs where instead air exists for the conventional thermoelectric device and to support adjacent p-type thermoelectric leg 10$p$ and n-type thermoelectric leg 10$n$, thereby increasing internal thermal resistance, decreasing contact resistance, increasing volumetric specific power, enhancing phonon scattering of the thermoelectric materials, reducing or even eliminating contact thermal expansion, avoiding current reflow, and greatly improving energy conversion efficiency for the thermoelectric device, thus meeting requirements on low carbon environmental protection, integration and high efficiency, and economic universality for energy conversion.

Further, for the high performance thermoelectric device 1 in embodiments of the present disclosure, the inner package 201 and the outer package 202 are provided for fixing the thermoelectric assembly 20, which serve as cushions for mechanical extrusion and thermo-stress existing inside the thermoelectric device and for mechanical impact to the thermoelectric device from outside environment, thereby providing a self-repair function to some extent and thus allowing the thermoelectric device to be able to work under various extreme environment.

With reference FIG. 1 again, in some embodiments, the high performance thermoelectric device 1 may be in a cubic structure. In some embodiments, a plurality of the high performance thermoelectric devices 1 may be combined in a manner of series connection, parallel connection or series-parallel connection. In some embodiments, the high performance thermoelectric device 1 when applied may be equipped with a DC/DC boosting module for managing electrical output of the high performance thermoelectric device 1. In a specific embodiment, the high performance thermoelectric device 1 is provided with an output end which may be equipped with the DC/DC boosting module. In another embodiment, if the plurality of the high performance thermoelectric devices 1 is combined in the manner of series connection, parallel connection or series-parallel connection, the final output end may be equipped with the DC/DC boosting module. Therefore, the high performance thermoelectric device 1 can be provided with enhanced output voltage.

With reference FIG. 1 again, in some embodiments, the p-type high-temperature thermoelectric leg 101$p$ may be made of a material selected from a group including a p-type SiGe-based material, a p-type CoSb$_3$-based material, a p-type SnSe-based material, a p-type PbSe-based material, a p-type Cu$_2$Se-based material, a p-type BiCuSeO-based material, a p-type Half-Heusler material, a p-type Cu(In,Ga)Te$_2$ material, a p-type FeSi$_2$-based material, CrSi$_2$, MnSi$_{1.73}$, CoSi, a p-type Cu$_{1.8}$S-based material and a p-type oxide material. In some embodiments, the p-type intermediate-temperature thermoelectric leg 105$p$ may be made of a material selected from a group including a p-type PbTe-based material, a p-type CoSb$_3$-based material, a p-type Half-Heusler material, a p-type Cu$_{1.8}$S-based material and a p-type AgSbTe$_2$-based material. In some embodiments, the p-type low-temperature thermoelectric leg 109$p$ may be made of a material selected from a group including a p-type Bi$_2$Te$_3$-based material, a p-type Sb$_2$Se$_3$-based material and a p-type Sb$_2$Te$_3$-based material. In some embodiments, the n-type high-temperature thermoelectric leg 101$n$ may be made of a material selected from a group including an n-type SiGe-based material, an n-type CoSb$_3$-based material, an n-type SnSe-based material, an n-type SnTe-based material, an n-type Cu$_2$Se-based material, an n-type Half-Heusler material and an n-type oxide material. In some embodiments, the n-type intermediate-temperature thermoelectric leg 105$n$ may be made of a material selected from a group including an n-type PbTe-based material, an n-type PbS-based material, an n-type CoSb$_3$-based material, an n-type Mg$_2$Si-based material, an n-type Zn$_4$Sb$_3$-based material, an n-type InSb-based material, an n-type Half-Heusler material, an n-type oxide material and an n-type AgSbTe$_2$-based material. In some embodiments, the n-type low-temperature thermoelectric leg 109$n$ may be made of a material selected from a group including an n-type Bi$_2$Te$_3$-based material, an n-type BiSb-based material, an n-type Zn$_4$Sb$_3$-based material, an n-type Mg$_3$Sb$_2$-based material, an n-type Bi$_2$Se$_3$-based material and an n-type Sb$_2$Se$_3$-based material.

With reference to FIG. 1 again, in some embodiments, the first blocking layer 102$p$ is of a thickness in a range of [0.01 mm, 0.1 mm]. For example, the first blocking layer 102$p$ may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the first blocking layer 102$p$ may be provided in a form of powders, film or foil. In some embodiments, the first blocking layer 102$p$ may be made of a material selected from a group including gold (Au), silver (Ag), tantalum (Ta), copper (Cu), titanium (Ti), titanium nitride (TiN), titanium tungsten (TiW), nickel (Ni) and molybdenum (Mo). For example, the first blocking layer 102$p$ may be made of Au, Cu, Ti or TiW, etc. In some other embodiments, the first blocking layer 102$p$ may be made of Au—Ag alloy, Cu—Ti—Ni alloy, Au—Ta—Cu—Ni—Mo alloy, etc. In some embodiments, the ninth blocking layer 110$a$ is of a thickness in a range of [0.01 mm, 0.1 mm]. For example, the ninth blocking layer 110$a$ may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the ninth blocking layer 110$a$ may be provided in a form of powders, film or foil. In some embodiments, the ninth blocking layer 110$a$ may be made of a material selected from a group including metal Au, Ag, Ta, Cu, Ti, TiN, TiW, Ni and Mo. For example, the ninth blocking layer 110$a$ may be made of Au, Cu, Ti or TiW, etc. In some other embodiments, the ninth blocking layer 110$a$ may be made of Au—Ag alloy, Cu—Ti—Ni alloy, Au—Ta—Cu—Ni—Mo alloy, etc. In some specific embodiments, the first blocking layer 102$p$ and the ninth blocking layer 110$a$ in one thermoelectric unit 10 are made of an identical material. It would be appreciated that, as shown in FIG. 1, the first blocking layer 102$p$ and the ninth blocking layer 110$a$ in one thermoelectric unit 10 are both in contact with one p-type high-temperature thermoelectric leg 101$p$. As such, the first blocking layer 102p and the ninth blocking layer 110a being made of the identical material allows reducing element diffusion between different materials; as well on the other hand, allows forming stress-match during manufacture of the thermoelectric unit 10 and thus enhancing structure stability of the thermoelectric unit 10.

With reference to FIG. 1 again, in some embodiments, the second blocking layer 104p is of a thickness in a range of [0.01 mm, 0.1 mm]. For example, the second blocking layer 104p may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the second blocking layer 104p may be provided in a form of powders, film or foil. In some embodiments, the second blocking layer 104p may be made of a material selected from a group including metal Au, Ag, Ta, Cu, Ti, TiN, TiW, Ni and Mo. For example, the second blocking layer 104p may be made of Au, Cu, Ti or TiW, etc. In some other embodiments, the second blocking layer 104p may be made of Au—Ag alloy, Cu—Ti—Ni alloy, Au—Ta—Cu—Ni—Mo alloy, etc. In some embodiments, the third blocking layer 106p is of a thickness in a range of [0.01 mm, 0.1 mm]. For example, the third blocking layer 106p may be of a thickness of 0.01 mm, 0.02 mm, 0.025 mm, 0.031 mm, 0.05 mm, 0.06 mm, 0.07 mm, 0.08 mm, 0.09 mm or 0.1 mm etc. In some embodiments, the third blocking layer 106p may be provided in a form of powders, film or foil. In some embodiments, the third blocking layer 106p may be made of a material selected from a group including metal Au, Ag, Ta, Cu, Ti, TiN, TiW, Ni and Mo. For example, the third blocking layer 106p may be made of Au, Cu, Ti or TiW, etc. In some other embodiments, the third blocking layer 106p be made of Au—Ag alloy, Cu—Ti—Ni alloy, Au—Ta—Cu—Ni—Mo alloy, etc. In some specific embodiments, the second blocking layer 104p and the third blocking layer 106p in one thermoelectric unit 10 are made of an identical material. It would be appreciated that, as shown in FIG. 1, the second blocking layer 104p and the third blocking layer 106p in one thermoelectric unit 10 are both in contact with one p-type intermediate-temperature thermoelectric leg 105p. As such, it would be convenient to select the identical material for manufacturing the second blocking layer 104p and third blocking layer 106p.

With reference FIG. 1 again, in some embodiments, the fourth blocking layer 108p is of a thickness in a range of [0.01 mm, 0.1 mm]. For example, the fourth blocking layer 108p may be of a thickness of 0.01 mm, 0.02 mm, 0.025 mm, 0.031 mm, 0.05 mm, 0.06 mm, 0.07 mm, 0.08 mm, 0.09 mm or 0.1 mm etc. In some embodiments, the fourth blocking layer 108p may be provided in a form of powders, film or foil. In some embodiments, the fourth blocking layer 108p may be made of a material selected from a group including metal Au, Ag, Ta, Cu, Ti, TiN, TiW, Ni and Mo. For example, the fourth blocking layer 108p may be made of Au, Cu, Ti or TiW, etc. In some other embodiments, the fourth blocking layer 108p may be made of Au—Ag alloy, Cu—Ti—Ni alloy, Au—Ta—Cu—Ni—Mo alloy, etc. In some specific embodiments, the twelfth blocking layer 112b is of a thickness in a range of [0.01 mm, 0.1 mm]. For example, the twelfth blocking layer 112b may be of thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the twelfth blocking layer 112b may be provided in a form of powders, film or foil. In some embodiments, the twelfth blocking layer 112b may be made of a material selected from a group including metal Au, Ag, Ta, Cu, Ti, TiN, TiW, Ni and Mo. For example, the twelfth blocking layer 112b may be made of Au, Cu, Ti or TiW, etc. In some other embodiments, the twelfth blocking layer 112b may be made of Au—Ag alloy, Cu—Ti—Ni alloy, Au—Ta—Cu—Ni—Mo alloy, etc. In some specific embodiments, the fourth blocking layer 108p and the twelfth blocking layer 112b which are both in contact with one p-type low-temperature thermoelectric leg 109p are made of an identical material. As such, it would be convenient to select the identical material for manufacturing the fourth blocking layer 108p and the twelfth blocking layer 112b; on the other hand, being made of the identical material allows forming stress-match during manufacture of the thermoelectric assembly 20 and thus enhancing structure stability of the thermoelectric assembly 20 (refer to FIG. 16).

With reference to FIG. 1 again, in some embodiments, the fifth blocking layer 102n is of a thickness in a range of [0.01 mm, 0.1 mm]. For example, the fifth blocking layer 102n may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the fifth blocking layer 102n may be provided in a form of powders, film or foil. In some embodiments, the fifth blocking layer 102n may be made of a material selected from a group including metal Au, Ag, Ta, Cu, Ti, TiN, TiW, Ni and Mo. For example, the fifth blocking layer 102n may be made of Au, Cu, Ti or TiW, etc. In some other embodiments, the fifth blocking layer 102n may be made of Au—Ag alloy, Cu—Ti—Ni alloy, Au—Ta—Cu—Ni—Mo alloy, etc. In some embodiments, the tenth blocking layer 112a is of a thickness in a range of [0.01 mm, 0.1 mm]. For example, the tenth blocking layer 112a may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the tenth blocking layer 112a may be provided in a form of powders, film or foil. In some embodiments, the tenth blocking layer 112a may be made of a material selected from a group including metal Au, Ag, Ta, Cu, Ti, TiN, TiW, Ni and Mo. For example, the tenth blocking layer 112a may be made of Au, Cu, Ti or TiW, etc. In some other embodiments, the tenth blocking layer 112a may be made of Au—Ag alloy, Cu—Ti—Ni alloy, Au—Ta—Cu—Ni—Mo alloy, etc. In some specific embodiments, the fifth blocking layer 102n and the tenth blocking layer 112a in one thermoelectric unit 10 are made of an identical material. It would be appreciated that, as shown in FIG. 1, the fifth blocking layer 102n and the tenth blocking layer 112a in one thermoelectric unit 10 are both in contact with one n-type high-temperature thermoelectric leg 101n. As such, it would be convenient to select the identical material for manufacturing the fifth blocking layer 102n and the tenth blocking layer 112a; on the other hand, being made of the identical material allows forming stress-match during manufacture of the thermoelectric unit 10 and thus enhancing structure stability of the thermoelectric unit 10.

With reference to FIG. 1 again, in some embodiments, the sixth blocking layer 104n is of a thickness in a range of [0.01 mm, 0.1 mm]. For example, the sixth blocking layer 104n may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the sixth blocking layer 104n may be provided in a form of powders, film or foil. In some embodiments, the sixth blocking layer 104n may be made of a material selected from a group including metal Au, Ag, Ta, Cu, Ti, TiN, TiW, Ni and Mo. For example, the sixth blocking layer 104n may be made of Au, Cu, Ti or TiW, etc. In some other embodiments, the sixth blocking layer 104n may be made of Au—Ag alloy, Cu—

Ti—Ni alloy, Au—Ta—Cu—Ni—Mo alloy, etc. In some specific embodiments, the seventh blocking layer 106n is of a thickness in a range of [0.01 mm, 0.1 mm]. For example, the seventh blocking layer 106n may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the seventh blocking layer 106n may be provided in a form of powders, film or foil. In some embodiments, the seventh blocking layer 106n may be made of a material selected from a group including metal Au, Ag, Ta, Cu, Ti, TiN, TiW, Ni and Mo. For example, the seventh blocking layer 106n may be made of Au, Cu, Ti or TiW, etc. In some other embodiments, the seventh blocking layer 106n may be made of Au—Ag alloy, Cu—Ti—Ni alloy, Au—Ta—Cu—Ni—Mo alloy, etc. In some specific embodiments, the sixth blocking layer 104n and the seventh blocking layer 106n in one thermoelectric unit 10 are made of an identical material. It would be appreciated that, as shown in FIG. 1, the sixth blocking layer 104n and the seventh blocking layer 106n in one thermoelectric unit 10 are both in contact with the one n-type intermediate-temperature thermoelectric leg 105n. As such, it would be convenient to select the identical material for manufacturing the sixth blocking layer 104n and the seventh blocking layer 106n.

With reference to FIG. 1 again, in some embodiments, the eighth blocking layer 108n is of a thickness in a range of [0.01 mm, 0.1 mm]. For example, the eighth blocking layer 108n may be of a thickness of 0.01 mm, 0.02 mm, 0.025 mm, 0.031 mm, 0.05 mm, 0.06 mm, 0.07 mm, 0.08 mm, 0.09 mm or 0.1 mm etc. In some embodiments, the eighth blocking layer 108n may be provided in a form of powders, film or foil. In some embodiments, the eighth blocking layer 108n may be made of a material selected from a group including metal Au, Ag, Ta, Cu, Ti, TiN, TiW, Ni and Mo. For example, the eighth blocking layer 108n may be made of Au, Cu, Ti or TiW, etc. In some other embodiments, the eighth blocking layer 108n may be made of Au—Ag alloy, Cu—Ti—Ni alloy, Au—Ta—Cu—Ni—Mo alloy, etc. In some embodiments, the eleventh blocking layer 110b is of a thickness in a range of [0.01 mm, 0.1 mm]. For example, the eleventh blocking layer 110b may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the eleventh blocking layer 110b may be provided in a form of powders, film or foil. In some embodiments, the eleventh blocking layer 110b may be made of a material selected from a group including metal Au, Ag, Ta, Cu, Ti, TiN, TiW, Ni and Mo. For example, the eleventh blocking layer 110b may be made of Au, Cu, Ti or TiW, etc. In some other embodiments, the eleventh blocking layer 110b may be made of Au—Ag alloy, Cu—Ti—Ni alloy, Au—Ta—Cu—Ni—Mo alloy, etc. In some specific embodiments, the eighth blocking layer 108n and the eleventh blocking layer 110b which are both in contact with one n-type low-temperature thermoelectric leg 109n are made of an identical material. As such, it would be convenient to select the identical material for manufacturing the eighth blocking layer 108n and the eleventh blocking layer 110b; on the other hand, being made of the identical material allows forming stress-match during manufacture of the thermoelectric assembly 20 and thus enhancing structure stability of the thermoelectric assembly 20 (refer to FIG. 16).

With reference to FIG. 1 again, in some embodiments, the first blocking layer 102p, the second blocking layer 104p, the third blocking layer 106p, the fourth blocking layer 108p, the fifth blocking layer 102n, the sixth blocking layer 104n, the seventh blocking layer 106n, the eighth blocking layer 108n, the ninth blocking layer 110a, the tenth blocking layer 112a, the eleventh blocking layer 110b and the twelfth blocking layer 112b are made of an identical material, such that it would be convenient to select the material for the blocking layers, thus further simplifying manufacture process of the high performance thermoelectric device 1.

With reference to FIG. 1 again, in some embodiments, the thickness of the first blocking layer 102p may be adjusted according to actual working environment of the high performance thermoelectric device 1; the thickness of the second blocking layer 104p may be adjusted according to actual working environment of the high performance thermoelectric device 1; the thickness of the third blocking layer 106p may be adjusted according to actual working environment of the high performance thermoelectric device 1; the thickness of the fourth blocking layer 108p may be adjusted according to actual working environment of the high performance thermoelectric device 1; the thickness of the fifth blocking layer 102n may be adjusted according to actual working environment of the high performance thermoelectric device 1; the thickness of the sixth blocking layer 104n may be adjusted according to actual working environment of the high performance thermoelectric device 1; the thickness of the seventh blocking layer 106n may be adjusted according to actual working environment of the high performance thermoelectric device 1; the thickness of the eighth blocking layer 108n may be adjusted according to actual working environment of the high performance thermoelectric device 1; the thickness of the ninth blocking layer 110a may be adjusted according to actual working environment of the high performance thermoelectric device 1; the thickness of the tenth blocking layer 112a may be adjusted according to actual working environment of the high performance thermoelectric device 1; the thickness of the eleventh blocking layer 110b may be adjusted according to actual working environment of the high performance thermoelectric device 1; and the thickness of the twelfth blocking layer 112b may be adjusted according to actual working environment of the high performance thermoelectric device 1.

With reference to FIG. 1, in some embodiments, the first stress-buffering layer 103p is of a thickness in a range of [0.01 mm, 0.1 mm]. For example, the first stress-buffering layer 103p may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the first stress-buffering layer 103p may be provided in a form of powders, film or foil. In some embodiments, the first stress-buffering layer 103p may be made of a material selected from a group including metal Cu, Pt, Ni and Cu—Mo alloy. For example, the first stress-buffering layer 103p may be made of Cu, Pt, Ni, etc. In some other embodiments, the first stress-buffering layer 103p may be made of Cu—Pt alloy, Cu—Ni alloy, Cu—Pt—Ni alloy or Cu—Mo alloy, etc. In some embodiments, the second stress-buffering layer 107p is of a thickness in a range of [0.01 mm, 0.1 mm]. For example, the second stress-buffering layer 107p may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the second stress-buffering layer 107p may be provided in a form of powders, film or foil. In some embodiments, the second stress-buffering layer 107p may be made of a material selected from a group including metal Cu, Pt, Ni and Cu—Mo alloy. For example, the second stress-buffering layer 107p may be made of Cu, Pt, Ni, etc. In some other embodiments, the second stress-buffering layer 107p may be made of Cu—Pt alloy, Cu—Ni alloy, Cu—Pt—Ni alloy or Cu—Mo alloy, etc. In some embodiments, the fifth stress-buffering layer 111a is of a thickness in a range of [0.01 mm, 0.1 mm]. For example, the fifth stress-buffering layer 111a may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the fifth stress-buffering layer 111a may be provided in a form of powders, film or foil. In some embodiments, the fifth stress-buffering layer 111a may be made of a material selected from a group including metal Cu, Pt, Ni and Cu—Mo alloy. For example, the fifth stress-buffering layer 111a may be made of Cu, Pt, Ni, etc. In some other embodiments, the fifth stress-buffering layer 111a may be made of Cu—Pt alloy, Cu—Ni alloy, Cu—Pt—Ni alloy or Cu—Mo alloy, etc. In some embodiments, the sixth stress-buffering layer 111b is of a thickness in a range of [0.01 mm, 0.1 mm]. For example, the sixth stress-buffering layer 111b may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the sixth stress-buffering layer 111b may be provided in a form of powders, film or foil. In some embodiments, the sixth stress-buffering layer 111b may be made of a material selected from a group including metal Cu, Pt, Ni and Cu—Mo alloy. For example, the sixth stress-buffering layer 111b may be made of Cu, Pt, Ni, etc. In some other embodiments, the sixth stress-buffering layer 111b may be made of Cu—Pt alloy, Cu—Ni alloy, Cu—Pt—Ni alloy or Cu—Mo alloy, etc. In some specific embodiments, the first stress-buffering layer 103p, the second stress-buffering layer 107p, the fifth stress-buffering layer 111a and the sixth stress-buffering layer 111b are made of an identical material.

It would be appreciated that, as shown in FIG. 1, the first stress-buffering layer 103p and the fifth stress-buffering layer 111a in one thermoelectric unit 10 are made of an identical material. Accordingly, it would be convenient to select the identical material for manufacturing the first stress-buffering layer 103p and the fifth stress-buffering layer 111a; on the other hand, being made of the identical material allows forming stress-match during manufacture of the thermoelectric unit 10 and thus enhancing structure stability of the thermoelectric unit 10. Similarly, the second stress-buffering layer 107p and the sixth stress-buffering layer 111b are made of an identical material. Accordingly, it would be convenient to select the identical material for manufacturing the second stress-buffering layer 107p and the sixth stress-buffering layer 111b; on the other hand, being made of the identical material allows forming stress-match during manufacture of the thermoelectric assembly 20 and thus enhancing structure stability of the thermoelectric assembly 20 (refer to FIG. 16). Besides, the first stress-buffering layer 103p and the second stress-buffering layer 107p are elements for the p-type thermoelectric leg 10p in one thermoelectric unit 10. Accordingly, it would be convenient to select the identical material for manufacturing the first stress-buffering layer 103p and the second stress-buffering layer 107p, thus simplifying manufacture process of the high performance thermoelectric device 1. In some embodiments, the p-type thermoelectric leg 10p and the n-type thermoelectric leg 10n in one thermoelectric unit are connected via the ninth blocking layer 110a, the fifth stress-buffering layer 111a and the tenth blocking layer 112a from the p-type high-temperature thermoelectric leg 101p to the n-type high-temperature thermoelectric leg 101n; while adjacent two thermoelectric units 10, which are arranged in one same row or arranged at the ends of adjacent two rows, are fixed and connected via the eleventh blocking layer 110b, the sixth stress-buffering layer 111b and the twelfth blocking layer 112b from the n-type low-temperature thermoelectric leg 109n of the upstream thermoelectric unit 10 to the p-type low-temperature thermoelectric leg 109p of the downstream thermoelectric unit 10. Since the fifth stress-buffering layer 111a and the sixth stress-buffering layer 111b provide a similar function, it would be convenient to select the identical material for manufacturing the fifth stress-buffering layer 111a and the sixth stress-buffering layer 111b, thus simplifying manufacture process of the high performance thermoelectric device 1.

With reference to FIG. 1 again, in some embodiments, the third stress-buffering layer 103n is of a thickness in a range of [0.01 mm, 0.1 mm]. For example, the third stress-buffering layer 103n may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the third stress-buffering layer 103n may be provided in a form of powders, film or foil. In some embodiments, the third stress-buffering layer 103n may be made of a material selected from a group including metal Cu, Pt, molybdenum oxide ($MoO_x$) and Cu—Mo alloy. For example, the third stress-buffering layer 103n may be made of Cu, Pt, Ni, etc. In some other embodiments, the third stress-buffering layer 103n may be made of Cu—Pt alloy, Cu—Ni alloy, Cu—Pt—Ni alloy, molybdenum oxide ($MoO_x$), Cu—Mo alloy, etc. In some embodiments, the fourth stress-buffering layer 107n is of a thickness in a range of [0.01 mm, 0.1 mm]. For example, the fourth stress-buffering layer 107n may be of a thickness of 0.01 mm, 0.02 mm, 0.025 mm, 0.031 mm, 0.05 mm, 0.06 mm, 0.07 mm, 0.08 mm, 0.09 mm or 0.1 mm, etc. In some embodiments, the fourth stress-buffering layer 107n may be provided in a form of powders, film or foil. In some embodiments, the fourth stress-buffering layer 107n may be made of a material selected from a group including metal Cu, Pt, Ni and Cu—Mo alloy. For example, the fourth stress-buffering layer 107n may be made of Cu, Pt, Ni, etc. In some other embodiments, the second stress-buffering layer 107p may be made of Cu—Pt alloy, Cu—Ni alloy, Cu—Pt—Ni alloy, molybdenum oxide ($MoO_x$), Cu—Mo alloy, etc. It would be appreciated that the third stress-buffering layer 103n and the fourth stress-buffering layer 107n are elements for the n-type thermoelectric leg 10n in one thermoelectric unit 10. Accordingly, it would be convenient to select the identical material for manufacturing the third stress-buffering layer 103n and the fourth stress-buffering layer 107n, thus simplifying manufacture process of the high performance thermoelectric device 1.

With reference to FIG. 1 again, in some embodiments, the first stress-buffering layer 103p, the second stress-buffering layer 107p, the third stress-buffering layer 103n, the fourth stress-buffering layer 107n, the fifth stress-buffering layer 111a and the sixth stress-buffering layer 111b are made of an identical material. As such, it would be convenient to select materials for the individual stress-buffering layers, thus further simplifying manufacture process of the high performance thermoelectric device 1.

With reference to FIG. 1 again, in some embodiments, the thickness of the first stress-buffering layer 103p may be adjusted according to actual working environment of the high performance thermoelectric device 1; the thickness of the second stress-buffering layer 107p may be adjusted according to actual working environment of the high performance thermoelectric device 1; the thickness of the third stress-buffering layer 103n may be adjusted according to actual working environment of the high performance thermoelectric device 1; the thickness of the fourth stress-buffering layer 107n may be adjusted according to actual working environment of the high performance thermoelectric device 1; the thickness of the fifth stress-buffering layer 111a may be adjusted according to actual working environment of the high performance thermoelectric device 1; and the thickness of the sixth stress-buffering layer 111b may be adjusted according to actual working environment of the high performance thermoelectric device 1.

With reference to FIG. 1 again, in some embodiments, the inner package 201 may be made of carbon fiber or Graphite Epoxy Composite (GEC). In some embodiments, the outer package 202 may be made of a FeNi KOVAR alloy.

Figure 16:
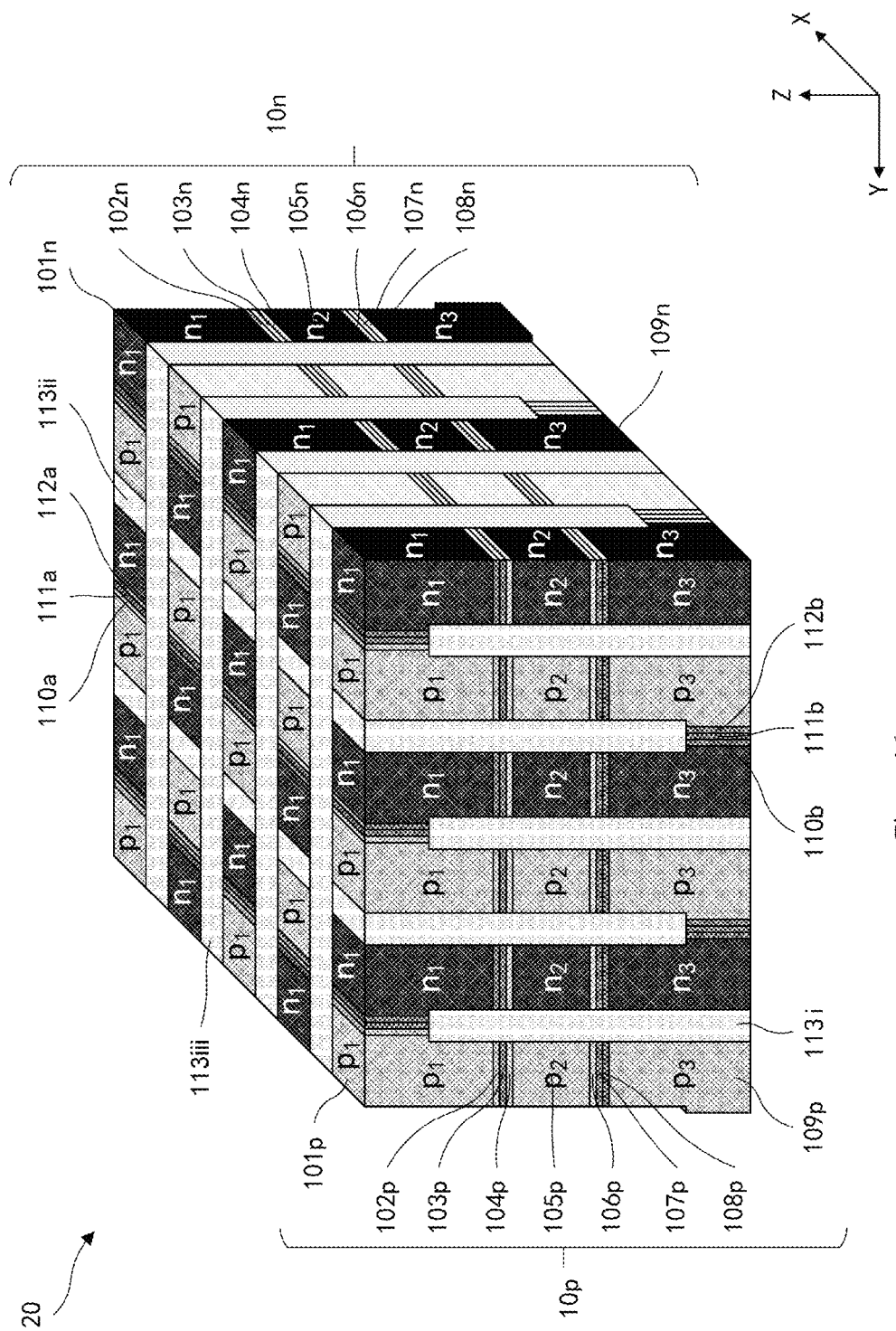
Figure 17:
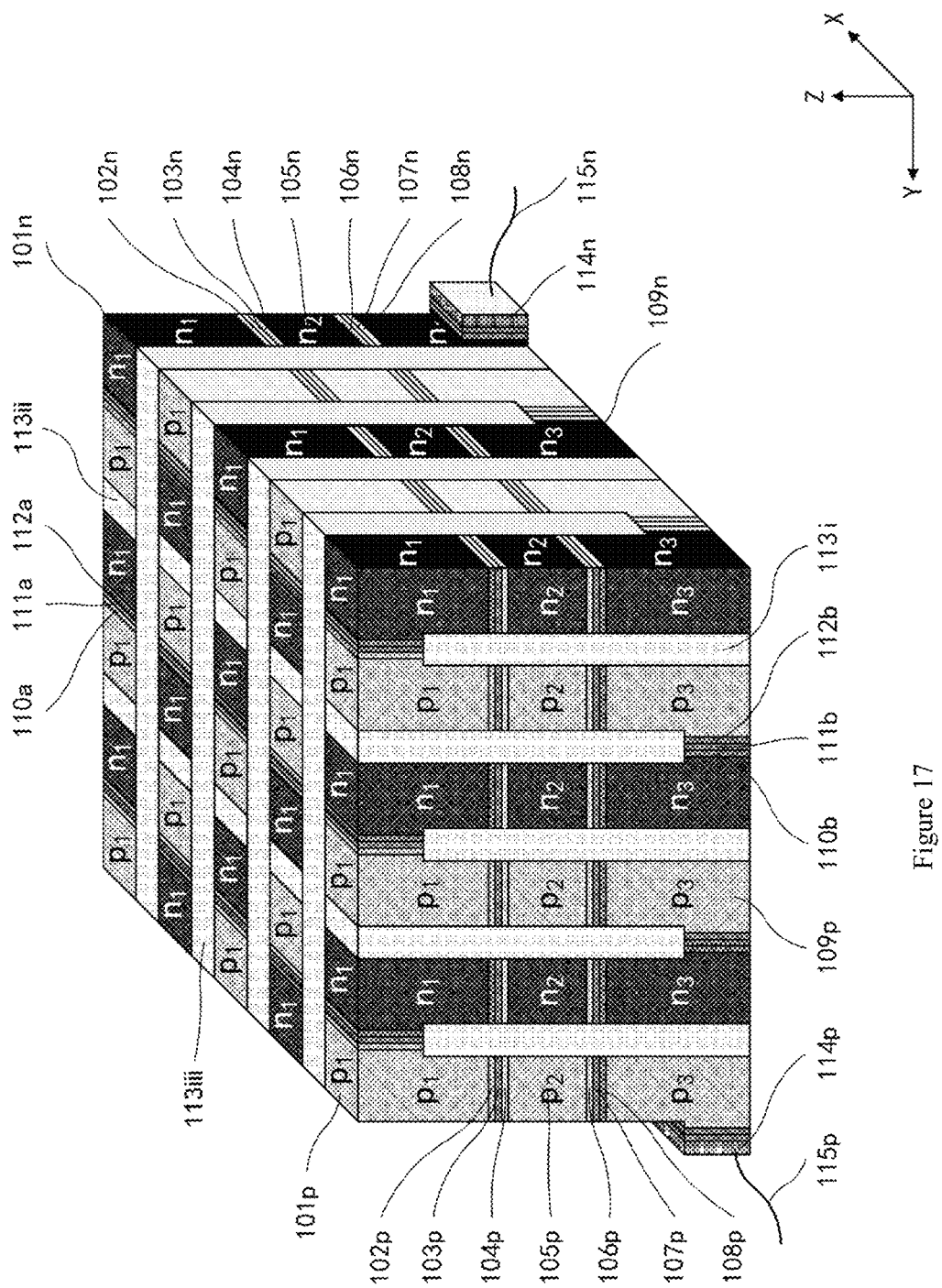

With reference to FIG. 1 and FIG. 16, in some embodiments, the package structure may be a single package. In some embodiments, the single package wraps the thermoelectric assembly 20. In some embodiments, the first electrical output wire 115p is connected to the first electrical output electrode 114p through the single package, and the second electrical output wire 115n is connected to the second electrical output electrode 114n through the single package. In some embodiments, the fourth insulating interlayer 113iv is provided between the thermoelectric assembly 20 and the single package. In some specific embodiments, the fourth insulating interlayer 113iv is only provided at the left and right sides of the outer surfaces of the thermoelectric assembly 20 (refer to FIG. 1). In some embodiments, the single package may be an inner package 201, which may be made of carbon fiber or Graphite Epoxy Composite (GEC), and through which the first electrical output wire 115p is connected to the first electrical output electrode 114p and the second electrical output wire 115n is connected to the second electrical output electrode 114n; and the fourth insulating interlayer 113iv is provided between the thermoelectric assembly 20 and the inner package 201. In some other embodiments, the single package may be an outer package 202, which is made of a FeNi KOVAR alloy, and through which the first electrical output wire 115p is connected to the first electrical output electrode 114p and the second electrical output wire 115n is connected to the second electrical output electrode 114n; and the fourth insulating interlayer 113iv is provided between the thermoelectric assembly 20 and the outer package 202.

With reference to FIG. 1 again, in some embodiments, the package structure includes both the inner package 201 and the outer package 202, the thickness of the inner package 201 may be adjusted according to actual working environment of the high performance thermoelectric device 1; and the thickness of the outer package 202 may be adjusted according to actual working environment of the high performance thermoelectric device 1. In some other embodiments, the package structure is a single package; the thickness of the single package may be adjusted according to actual working environment of the high performance thermoelectric device 1 as well.

With reference to FIG. 1 again, in some embodiments, the phonon scattering layer 113a (refer to FIG. 11) in the insulating interlayer 113 is of a thickness in a range of [1 nm, 100 nm]. For example, the phonon scattering layer 113a may be of a thickness of 1 nm, 15 nm, 30 nm, 41.3 nm, 57 nm, 66 nm, 70 nm, 85 nm, 93 nm, 98 nm or 100 nm, etc. In some embodiments, the number of the phonon scattering layers 113a is in a range of [10, 10000]. For example, the number of the phonon scattering layers 113a is 10, 68, 100, 827, 1000, 2500, 4000, 5100, 6015, 7777, 8000, 9000 or 10000, etc. In some embodiments, the phonon scattering layer 113a may be made of a material selected from a group including $SiO_2$, $Al_2O_3$, AlN, MgO, $TiO_2$, $Si_3N_4$ and SiC. For example, the phonon scattering layer 113a may be $SiO_2$, $Al_2O_3$, $Si_3N_4$ or $TiO_2$. In some other embodiments, the phonon scattering layer 113a may be made of a $SiO_2$—$Al_2O_3$ mixture, a AlN—MgO—$Si_3N_4$—SiC mixture, and a $SiO_2$—$Al_2O_3$—AlN—MgO—$TiO_2$—$Si_3N_4$—SiC mixture, etc. Because the insulating interlayer 113 includes a plurality of the phonon scattering layers 113a, in some specific embodiments, when the first one in the plurality of the phonon scattering layers 113a is determined to be made of a certain material, the rest in the plurality of the phonon scattering layers 113a are also made of said certain material. As such, it would be convenient to select materials for the plurality of the phonon scattering layers 113a, and thus facilitating manufacture of the insulating interlayer 113.

With reference to FIG. 1 again, in some embodiments, the negative thermal expansion buffering layer 113b (refer to FIG. 11) in the insulating interlayer 113 of a thickness in a range of [1 nm, 100 nm]. For example, the negative thermal expansion buffering layer 113b may be of a thickness of 1 nm, 15 nm, 30 nm, 41.3 nm, 57 nm, 66 nm, 70 nm, 85 nm, 93 nm, 98 nm or 100 nm, etc. In some embodiments, the number of the negative thermal expansion buffering layers 113b is in a range of [10, 10000]. For example, the number of the negative thermal expansion buffering layers 113b may be 10, 68, 100, 827, 1000, 2500, 4000, 5100, 6015, 7777, 8000, 9000 or 10000, etc. In some embodiments, the negative thermal expansion buffering layer 113b may be made of a material selected from a group including $SiO_2$, $Al_2O_3$, AlN, MgO, $TiO_2$, $Si_3N_4$ and SiC. For example, the negative thermal expansion buffering layer 113b may be $SiO_2$, $Al_2O_3$, $Si_3N_4$ or $TiO_2$. In some other embodiments, the negative thermal expansion buffering layer 113b may be made of a $SiO_2$—$Al_2O_3$ mixture, a AlN—MgO—$Si_3N_4$—SiC mixture, and a $SiO_2$—$Al_2O_3$—AlN—MgO—$TiO_2$—$Si_3N_4$—SiC mixture, etc. Because the insulating interlayer 113 includes a plurality of the negative thermal expansion buffering layers 113b, in some specific embodiments, when the first one in the plurality of the negative thermal expansion buffering layers 113b is determined to be made of a certain material, the rest in the plurality of the negative thermal expansion buffering layer 113b are also made of said certain material. As such, it would be convenient to select materials for the plurality of the negative thermal expansion buffering layer 113b, and thus facilitating manufacture of the insulating interlayer 113.

With reference to FIG. 1 again, in some embodiments, the first electrical output electrode 114p may be made of a material selected from a group including metal Cu, Au, Ag, Mo, W, Fe, Pd, Pt, Al, Ni and Ti. In some embodiments, the second electrical output electrode 114n may be made of a material selected from a group including metal Cu, Au, Ag, Mo, W, Fe, Pd, Pt, Al, Ni or Ti. In some specific embodiments, the first electrical output electrode 114p and the second electrical output electrode 114n are made of an identical material. As such, it would be convenient to select materials for the electrical output electrodes, and thus facilitating manufacture of the high performance thermoelectric device 1.

With reference to FIG. 1 again, in some embodiments, the first electrical output wire 115p and the second electrical output wire 115n, made of an identical material, each are a polyvinyl chloride insulation copper core wire.

With reference to FIGS. 8 to 20, the present disclose further provides in embodiments a method of manufacturing a high performance thermoelectric device 1 at ultra-high speed. In some embodiments, the method includes the following steps.

Step 1: Manufacture of a Thermoelectric Unit 10

ST01: respective elemental powders for a p-type high-temperature thermoelectric leg 101p, a p-type intermediate-temperature thermoelectric leg 105p, a p-type low-temperature thermoelectric leg 109p, an n-type high-temperature thermoelectric leg 101n, an n-type intermediate-temperature thermoelectric leg 105n and an n-type low-temperature thermoelectric leg 109n are weighted at a stoichiometric ratio of individual elements, to obtain respective powders for individual thermoelectric materials; respective elemental powders for a first blocking layer 102p, a second blocking layer 104p, a third blocking layer 106p, a fourth blocking layer 108p, a fifth blocking layer 102n, a sixth blocking layer 104n, a seventh blocking layer 106n, an eighth blocking layer 108n, a ninth blocking layer 110a and a tenth blocking layer 112a are weighted to obtain respective powders for individual blocking layers; and respective elemental powders for a first stress-buffering layer 103p, a second stress-buffering layer 107p, a third stress-buffering layer 103n, a fourth stress-buffering layer 107n and a fifth stress-buffering layer 111a are weighted to obtain respective powders for individual stress-buffering layers.

In specific, for example, a p-type $CoSb_3$-based material is taken for the p-type high-temperature thermoelectric leg 101p, a p-type PbTe-based material is taken for the p-type intermediate-temperature thermoelectric leg 105p, and a p-type $Bi_2Te_3$-based material is taken for the p-type low-temperature thermoelectric leg 109p; while an n-type $CoSb_3$-based material is taken for the n-type high-temperature thermoelectric leg 101n, an n-type PbTe-based material is taken for the n-type intermediate-temperature thermoelectric leg 105n; and an n-type $Bi_2Te_3$-based material is taken for the n-type low-temperature thermoelectric leg 109n. These indicated materials are weighted at a stoichiometric ratio of individual elements, to obtain respective powders of individual thermoelectric materials. A metal Mo is taken for the first blocking layer 102p, a metal Cu is taken for the first stress-buffering layer 103p, the metal Mo is taken for the second blocking layer 104p, the metal Mo is taken for the third blocking layer 106p, the metal Cu is taken for the second stress-buffering layer 107p, TiN is taken for the fourth blocking layer 108p, the metal Mo is taken for the fifth blocking layer 102n, $MoO_x$ is taken for the third stress-buffering layer 103n, the metal Mo is taken for the sixth blocking layer 104n, the metal Mo is taken for the seventh blocking layer 106n, $MoO_x$ is taken for the fourth stress-buffering layer 107n, TiN is taken for the eighth blocking layer 108n, the metal Mo is taken for the ninth blocking layer 110a, the metal Cu is taken for the fifth stress-buffering layer 111a, and the metal Mo is taken for the tenth blocking layer 112a. These indicated materials are weighted to obtain respective powders of individual blocking layers and respective powders of individual stress-buffering layers.

Figure 9:
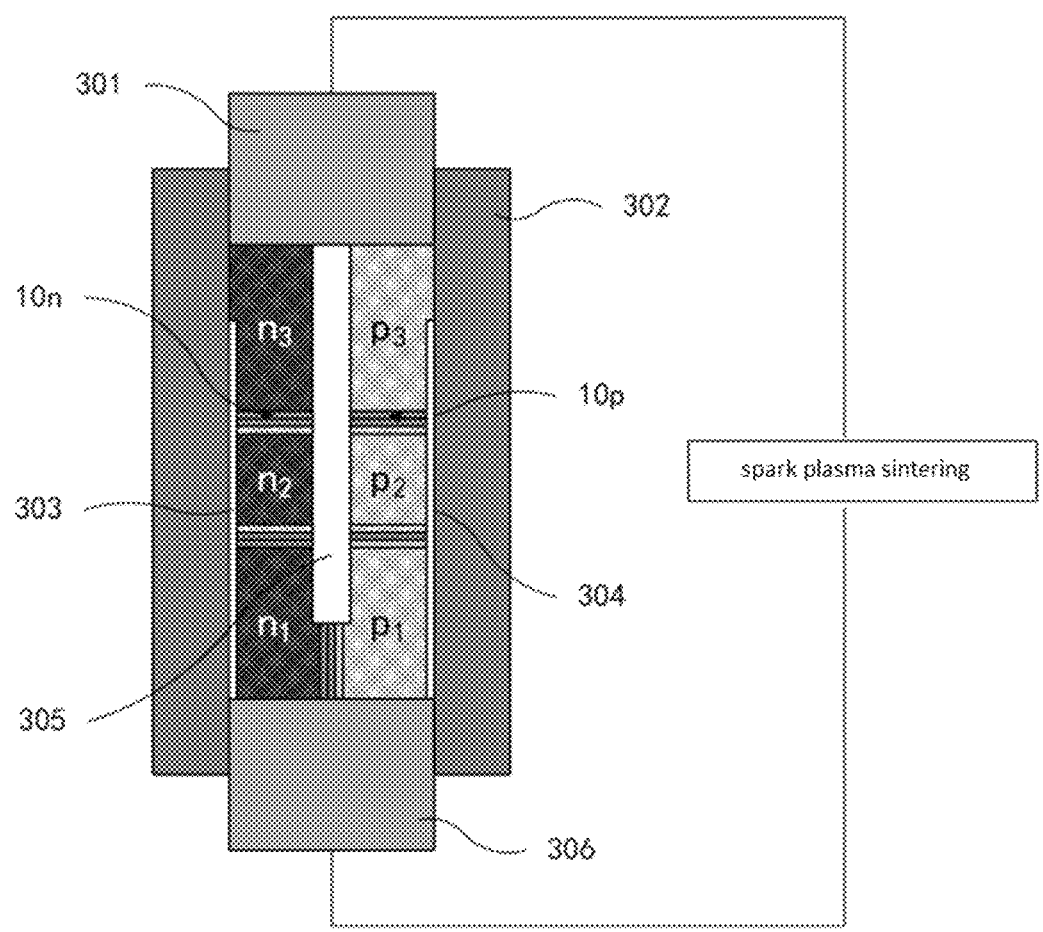
FIGS. 9 to 20 provide various structural representations for a high performance thermoelectric device in some embodiments of the present disclosure.
Figure 10:
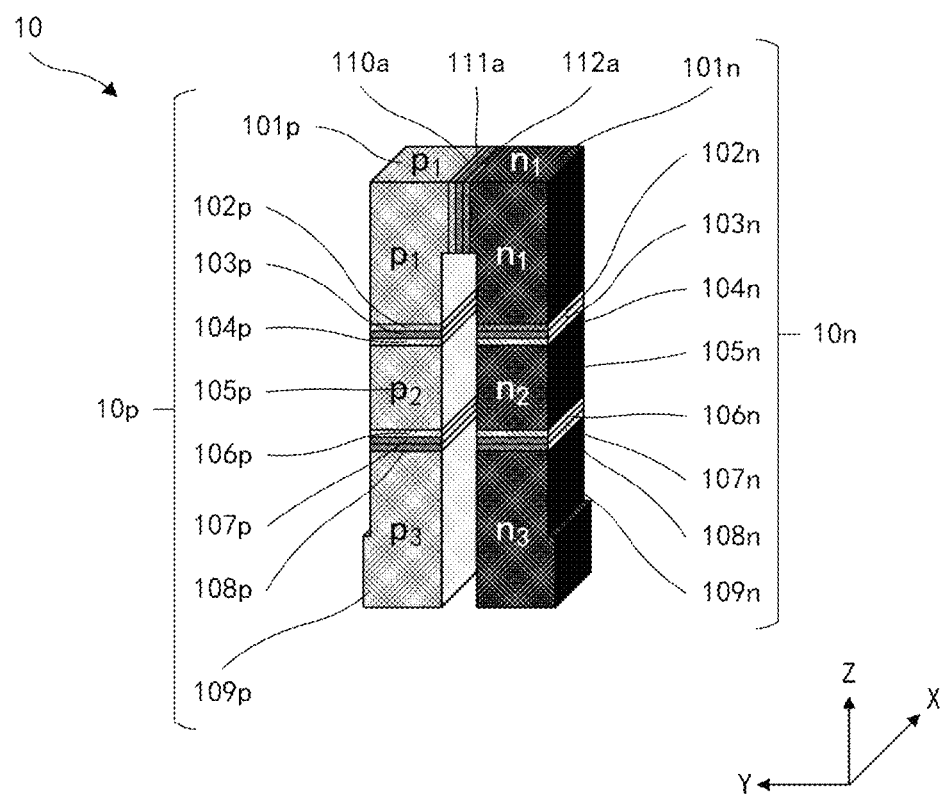

ST02: the respective powders of individual thermoelectric materials, the respective powders of individual blocking layers and the respective powders of individual stress-buffering layers are placed in a space enclosed by a mold 302, an upper pressing head 301 and a lower pressing head 306 in a sequence of a thermoelectric material layer, a blocking layer, a stress-buffering layer, a blocking layer, a thermoelectric material layer, a blocking layer, a thermoelectric material layer, a blocking layer, a stress-buffering layer, a blocking layer, a thermoelectric material layer for each thermoelectric leg, wherein a p-type thermoelectric leg 10p and an n-type thermoelectric leg 10n formed with the respective powders of individual layers are connected via the ninth blocking layer 110a, the fifth stress-buffering layer 111a and the tenth blocking layer 112a (three of which are in a form of respective thin film) from the p-type high-temperature thermoelectric leg 101p to the n-type high-temperature thermoelectric leg 101n; are partitioned by a first partition 303, a middle partition 305 and a second partition 304, which are subjected to spark plasma sintering, thus forming a thermoelectric block (refer to FIG. 9 and FIG. 10).

In some embodiments, the upper pressing head 301 and the lower pressing head 306 each are made of graphite. In some embodiments, the mold 302 is made of a material selected from a group including graphite, an alloy, an $Al_2O_3$-based ceramic, an AlN-based ceramic, a $Si_3N_4$-based ceramic and a SiC-based ceramic. For example, the mold 302 may be made of graphite, $Al_2O_3$-based ceramic, SiC-based ceramic, etc. In some other embodiments, the mold 302 may be made of a graphite-alloy mixture or a $Al_2O_3$-based ceramic-AlN-based ceramic-$Si_3N_4$-based ceramic mixture. In some embodiments, the first partition 303, the middle partition 305 and the second partition 304 each are made of graphite or ceramic. In some specific embodiments, the first partition 303, the middle partition 305 and the second partition 304 are made of an identical material.

In specific, for example, graphite is taken for the upper pressing head 301, the lower pressing head 306, the first partition 303, the middle partition 305, and the second partition 304. In some embodiments, the respective powders of individual thermoelectric materials, the respective powders of individual blocking layers and the respective powders of individual stress-buffering layers are placed in a space enclosed by a mold 302, an upper pressing head 301 and a lower pressing head 306 in a sequence of a thermoelectric material layer, a blocking layer, a stress-buffering layer, a blocking layer, a thermoelectric material layer, a blocking layer, a thermoelectric material layer, a blocking layer, a stress-buffering layer, a blocking layer, a thermoelectric material layer for each thermoelectric leg, wherein a p-type thermoelectric leg 10p and an n-type thermoelectric leg 10n formed with the respective powders of individual layers are connected via the ninth blocking layer 110a, the fifth stress-buffering layer 111a and the tenth blocking layer 112a (three of which are in a form of respective thin film) from the p-type high-temperature thermoelectric leg 101p to the n-type high-temperature thermoelectric leg 101n; and are partitioned by a first partition 303, a middle partition 305 and a second partition 304, which are subjected to spark plasma sintering, thus forming a thermoelectric block.

ST03: The thermoelectric block is cut to form a thermoelectric unit 10. Phonon scattering layers 113a and negative thermal expansion buffering layers 113b are provided alternately by chemical vapor deposition, thus forming an insulating interlayer 113. The insulating interlayer 113 is inserted into the thermoelectric unit 10 or between the thermoelectric units 10 for fixation (refer to FIGS. 11 and 12).

In specific, for example, $SiO_2$ is taken for the phonon scattering layer 113a, $ZrW_2O_8$ is taken for the negative thermal expansion buffering layer 113b. The phonon scattering layers 113a each made of $SiO_2$ and the negative thermal expansion buffering layers 113b each made of $ZrW_2O_8$ are provided alternately by chemical vapor deposition, thus forming an insulating interlayer 113. The insulating interlayer 113 is inserted into the thermoelectric unit 10 or between the thermoelectric units 10 for fixation, thereby completing the manufacture of the thermoelectric unit 10.

Step 2: Manufacture of a Thermoelectric Assembly 20

ST04: a plurality of thermoelectric units (10) is arranged in an array; an eleventh blocking layer 110b, a sixth stress-buffering layer 111b and a twelfth blocking layer 112b are provided, by depositing, electroplating or sputtering, from a protruding section of the n-type low-temperature thermoelectric leg 109n of the upstream thermoelectric unit 10 to a protruding section of the p-type low-temperature thermoelectric leg 109p of the downstream thermoelectric unit 10 for adjacent two thermoelectric units 10 arranged in one same row and for adjacent two thermoelectric units 10 arranged at the ends of adjacent two rows, such that a thermoelectric assembly 20 is formed (refer to FIGS. 13 to 16).

In specific, a plurality of thermoelectric units 10 is arranged in an array. For example, TiN is taken for the eleventh blocking layer 110b, a metal Cu is taken for the sixth stress-buffering layer 111b, and TiN is taken for the twelfth blocking layer 112b. TiN as the eleventh blocking layer 110b, the metal Cu as the sixth stress-buffering layer 111b and TiN as the twelfth blocking layer 112b are provided, by depositing, electroplating or sputtering, from a protruding section of the n-type low-temperature thermoelectric leg 109n of the upstream thermoelectric unit 10 to a protruding section of the p-type low-temperature thermoelectric leg 109p of the downstream thermoelectric unit 10 for adjacent two thermoelectric units 10 arranged in one same row, and for adjacent two thermoelectric units (10) arranged at the ends of adjacent two rows, such that a thermoelectric assembly 20 is formed.

ST05: A first electrical output electrode 114p and a second electrical output electrode 114n are provided for the thermoelectric assembly 20 by electroplating, and a first electrical output wire 115p and a second electrical output wire 115n are provided to connect to the first electrical output electrode 114p and the second electrical output electrode 114n, respectively (refer to FIG. 17 and FIG. 18).

In specific, for example, a metal Cu is taken for the first electrical output electrode 114p and the second electrical output electrode 114n, and polyvinyl chloride insulation copper core wire is taken for the first electrical output wire 115p and the second electrical output wire 115n. For two thermoelectric units 10 to be assembled, the p-type low-temperature thermoelectric leg 109p of one thermoelectric unit 10 is provided, by electroplating metal Cu, with the first electrical output electrode 114p which is further provided with the first electrical output wire 115p by welding; while the n-type low-temperature thermoelectric leg 109n of the other one thermoelectric unit 10 is provided, by electroplating metal Cu, with the second electrical output electrode 114n which is further provided with the second electrical output wire 115n by welding, thereby completing the assembly of the thermoelectric assembly 20.

In some other embodiments, plasma spraying, evaporation or sputtering may also be used for manufacture of the first electrical output electrode 114p and the second electrical output electrode 114n.

Step 3: Wrapping with an Inner Package 201 and an Outer Package 202

ST06: In some embodiments, the thermoelectric assembly 20 is wrapped with carbon fiber by means of a high-temperature sealant, so as to form the inner package 201. In some other embodiments, the inner package 201 is wrapped with a FeNi KOVAR alloy, so as to form the outer package 202 which is sealed by a sealant at seams (refer to FIG. 19 and FIG. 20).

In some other embodiments, the package structure is a single package, and the thermoelectric assembly 20 is only wrapped with carbon fiber by means of a high-temperature sealant, so as to form the single package; alternatively, the thermoelectric assembly 20 is wrapped with a FeNi KOVAR alloy only, so as to form the single package which is sealed by a sealant at seams.

The thermoelectric unit 10 provided in embodiments of the present application is manufactured in one-shot molding by a hot-pressing process in combination with partitions, such that segmented high-temperature, intermediate-temperature and low-temperature thermoelectric materials can be directly sintered together with the blocking layers and stress-buffering layer, thereby reducing mutual diffusion between elements, increasing interlayer bonding strength and thermo-match degree for the segmented thermoelectric device, and decreasing contact resistance.

Reference throughout this specification to "an embodiment", "some embodiments", "one embodiment", "another example", "an example", "a specific example" or "some examples" means that a particular feature, structure, material, or characteristic described in connection with the embodiment or example is included in at least one embodiment or example of the present disclosure. Thus, the appearances of the phrases such as "in some embodiments", "in one embodiment", "in an embodiment", "in another example", "in an example", "in a specific example" or "in some examples" in various places throughout this specification are not necessarily referring to the same embodiment or example of the present disclosure. Furthermore, the particular features, structures, materials, or characteristics may be combined in any suitable manner in one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A high performance thermoelectric device (1), comprising a thermoelectric assembly (20),
wherein the thermoelectric assembly (20) comprises a plurality of thermoelectric units (10) arranged in an array and a plurality of insulating interlayers (113),
wherein each thermoelectric unit (10) comprises a p-type thermoelectric leg (10p) and an n-type thermoelectric leg (10n),
wherein the p-type thermoelectric leg (10p) comprises a p-type high-temperature thermoelectric leg (101p), a first blocking layer (102p), a first stress-buffering layer (103p), a second blocking layer (104p), a p-type intermediate-temperature thermoelectric leg (105p), a third blocking layer (106p), a second stress-buffering layer (107p), a fourth blocking layer (108p), a p-type low-temperature thermoelectric leg (109p) from top to bottom in sequence; and
wherein the n-type thermoelectric leg (10n) comprises an n-type high-temperature thermoelectric leg (101n), a fifth blocking layer (102n), a third stress-buffering layer (103n), a sixth blocking layer (104n), an n-type intermediate-temperature thermoelectric leg (105n), a seventh blocking layer (106n), a fourth stress-buffering layer (107n), an eighth blocking layer (108n), an n-type low-temperature thermoelectric leg (109n) from top to bottom in sequence, wherein the p-type thermoelectric leg (10p) and the n-type thermoelectric leg (10n) in one thermoelectric unit are connected via a ninth blocking layer (110a), a fifth stress-buffering layer (111a) and a tenth blocking layer (112a) from the p-type high-temperature thermoelectric leg (101p) to the n-type high-temperature thermoelectric leg (101n), thus forming the thermoelectric unit, wherein adjacent two thermoelectric units (10), which are arranged in one same row or arranged at the ends of adjacent two rows, are fixed and connected via an eleventh blocking layer (110b), a sixth stress-buffering layer (111b) and a twelfth blocking layer (112b) from the n-type low-temperature thermoelectric leg (109n) of the upstream thermoelectric unit (10) to the p-type low-temperature thermoelectric leg (109p) of the downstream thermoelectric unit (10), wherein the plurality of insulating interlayers (113) is provided for the plurality of thermoelectric units (10) to form the thermoelectric assembly (20), wherein the p-type low-temperature thermoelectric leg (109p) and the n-type low-temperature thermoelectric leg (109n) diagonally arranged at the bottom of the thermoelectric assembly (20) are provided with a first electrical output electrode (114p) and a second electrical output electrode (114n), respectively, wherein each insulating interlayer (113) comprises a plurality of phonon scattering layers (113a) and a plurality of negative thermal expansion buffering layers (113b) stacked alternately.

2. The high performance thermoelectric device (1) according to claim 1, wherein the high performance thermoelectric device (1) is in a cubic structure.

3. The high performance thermoelectric device (1) according to claim 1, wherein a plurality of the high performance thermoelectric devices (1) is combined in a manner of series connection, parallel connection or series-parallel connection.

4. The high performance thermoelectric device (1) according to claim 1, wherein
the p-type high-temperature thermoelectric leg (101p) is made of a material selected from a group comprising a p-type SiGe-based material, a p-type $CoSb_3$-based material, a p-type SnSe-based material, a p-type PbSe-based material, a p-type $Cu_2Se$-based material, a p-type BiCuSeO-based material, a p-type Half-Heusler material, a p-type Cu(In, Ga)$Te_2$ material, a p-type $FeSi_2$-based material, $CrSi_2$, $MnSi_{1.73}$, CoSi, a p-type $Cu_{1.8}S$-based material and a p-type oxide material;

the p-type intermediate-temperature thermoelectric leg (105p) is made of a material selected from a group comprising a p-type PbTe-based material, a p-type $CoSb_3$-based material, a p-type Half-Heusler material, a p-type $Cu_{1.8}S$-based material and a p-type $AgSbTe_2$-based material; and the p-type low-temperature thermoelectric leg (109p) is made of a material selected from a group comprising a p-type $Bi_2Te_3$-based material, a p-type $Sb_2Se_3$-based material and a p-type $Sb_2Te_3$-based material.

5. The high performance thermoelectric device (1) according to claim 1, wherein
the n-type high-temperature thermoelectric leg (101n) is made of a material selected from a group comprising an n-type SiGe-based material, an n-type $CoSb_3$-based material, an n-type SnSe-based material, an n-type SnTe-based material, an n-type $Cu_2Se$-based material, an n-type Half-Heusler material and an n-type oxide material;

the n-type intermediate-temperature thermoelectric leg (105n) is made of a material selected from a group comprising an n-type PbTe-based material, an n-type PbS-based material, an n-type $CoSb_3$-based material, an n-type $Mg_2Si$-based material, an n-type $Zn_4Sb_3$-based material, an n-type InSb-based material, an n-type Half-Heusler material, an n-type oxide material and an n-type $AgSbTe_2$-based material; and the n-type low-temperature thermoelectric leg (109n) is made of a material selected from a group comprising an n-type $Bi_2Te_3$-based material, an n-type BiSb-based material, an n-type $Zn_4Sb_3$-based material, an n-type $Mg_3Sb_2$-based material, an n-type $Bi_2Se_3$-based material and an n-type $Sb_2Se_3$-based material.

6. The high performance thermoelectric device (1) according to claim 1, wherein the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are of a thickness in a range of [0.01 mm, 0.1 mm].

7. The high performance thermoelectric device (1) according to claim 1, wherein the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are provided in a form of powders, film or foil.

8. The high performance thermoelectric device (1) according to claim 1, wherein the first blocking layer (102p), the second blocking layer (104p), the third blocking layer (106p), the fourth blocking layer (108p), the fifth blocking layer (102n), the sixth blocking layer (104n), the seventh blocking layer (106n), the eighth blocking layer (108n), the ninth blocking layer (110a), the tenth blocking layer (112a), the eleventh blocking layer (110b) and the twelfth blocking layer (112b) each are made of a material selected from a group comprising gold, silver, tantalum, copper, titanium, titanium nitride, titanium tungsten, nickel and molybdenum; and wherein the first blocking layer (102p) and the ninth blocking layer (110a) are made of an identical material; the second blocking layer (104p) and the third blocking layer (106p) are made of an identical material; the fourth blocking layer (108p) and the twelfth blocking layer (112b) are made of an identical material; the fifth blocking layer (102n) and the tenth blocking layer (112a) are made of an identical material; the sixth blocking layer (104n) and the seventh blocking layer (106n) are made of an identical material; and the eighth blocking layer (108n) and the eleventh blocking layer (110b) are made of an identical material.

9. The high performance thermoelectric device (1) according to claim 1, wherein the first stress-buffering layer (103p), the second stress-buffering layer (107p), the third stress-buffering layer (103n), the fourth stress-buffering layer (107n), the fifth stress-buffering layer (111a) and the sixth stress-buffering layer (111b) each are of a thickness in a range of [0.01 mm, 0.1 mm].

10. The high performance thermoelectric device (1) according to claim 1, wherein the first stress-buffering layer (103p), the second stress-buffering layer (107p), the third stress-buffering layer (103n), the fourth stress-buffering layer (107n), the fifth stress-buffering layer (111a) and the sixth stress-buffering layer (111b) each are provided in a form of powders, film or foil.

11. The high performance thermoelectric device (1) according to claim 1, wherein the first stress-buffering layer (103p), the second stress-buffering layer (107p), the fifth stress-buffering layer (111a) and the sixth stress-buffering layer (111b) each are made of a material selected from a group comprising copper, platinum, nickel, copper-molybdenum alloy; the first stress-buffering layer (103p), the second stress-buffering layer (107p), the fifth stress-buffering layer (111a) and the sixth stress-buffering layer (111b) are made of an identical material; and
wherein the third stress-buffering layer (103n) and the fourth stress-buffering layer (107n) each are made of a material selected from a group comprising molybdenum oxide, copper, platinum, nickel, copper-molybdenum alloy; the third stress-buffering layer (103n) and the fourth stress-buffering layer (107n) are made of an identical material.

12. The high performance thermoelectric device (1) according to claim 1, wherein the first electrical output electrode (114p) and the second electrical output electrode (114n) each are made of a material selected from a group comprising gold, palladium, platinum, aluminum, copper, nickel and titanium; the first electrical output electrode (114p) and the second electrical output electrode (114n) are made of an identical material.

13. The high performance thermoelectric device (1) according to claim 1,
wherein the plurality of insulating interlayers (113) comprises a plurality of first insulating interlayers (113i), a plurality of second insulating interlayers (113ii), a plurality of third insulating interlayers (113iii) and a plurality of fourth insulating interlayers (113iv),
wherein the first insulating interlayer (113i) is inserted between the p-type thermoelectric leg (10p) and the n-type thermoelectric leg (10n) for each thermoelectric unit (10),
wherein the second insulating interlayer (113ii) is inserted between adjacent two thermoelectric units (10) in one same row,
wherein the third insulating interlayer (113iii) is inserted between adjacent two rows of thermoelectric units (10), and
wherein the fourth insulating interlayer (113iv) is provided at a side surface of the thermoelectric assembly (20).

14. The high performance thermoelectric device (1) according to claim 1, further comprising a package structure, wherein the package structure comprises one or more packages wrapping the thermoelectric assembly (20).

15. The high performance thermoelectric device (1) according to claim 14, wherein the first electrical output electrode (114p) and the second electrical output electrode (114n) are respectively provided with a first electrical output wire (115p) and a second electrical output wire (115n) passing through the one or more packages.

16. The high performance thermoelectric device (1) according to claim 13, wherein each phonon scattering layer (113a) is a nanoparticle insulating layer, a thickness of each phonon scattering layer (113a) is in a range of [1 nm, 100 nm], the number of the phonon scattering layers (113a) is in a range of [10, 10000], and each phonon scattering layer (113a) is made of a material selected from a group comprising $SiO_2$, $Al_2O_3$, AlN, MgO, $TiO_2$, $Si_3N_4$ and SiC; and
a thickness of each negative thermal expansion buffering layer (113b) is in a range of [1 nm, 100 nm], the number of the negative thermal expansion buffering layers (113b) is in a range of [10, 10000], and each negative thermal expansion buffering layer (113b) is made of a material selected from a group comprising $BaTiO_3$, $PbTiO_3$, $LaCrO_3$, $ZrW_2O_8$, $ZrV_2O_7$ and $HfW_2O_8$.

17. The high performance thermoelectric device (1) according to claim 14, wherein the package structure comprises an inner package (201) and an outer package (202),
wherein the inner package (201) is made of a material selected from a group comprising carbon fiber and Graphite Epoxy Composite, and the outer package (202) is made of a material selected from a group comprising a FeNi KOVAR alloy.

\* \* \* \* \*